United States Patent
Beadell et al.

(10) Patent No.: US 7,118,483 B2
(45) Date of Patent: Oct. 10, 2006

(54) MODULAR CPU ENCLOSURE FOR GAMING MACHINES

(75) Inventors: John Leagh Beadell, Sparks, NV (US); James W. Stockdale, Clio, CA (US)

(73) Assignee: IGT, Reno, NV (US)

(*) Notice: Subject to any disclaimer, the term of this patent is extended or adjusted under 35 U.S.C. 154(b) by 0 days.

(21) Appl. No.: 10/752,662

(22) Filed: Jan. 6, 2004

(65) Prior Publication Data
US 2004/0142753 A1 Jul. 22, 2004

Related U.S. Application Data

(62) Division of application No. 09/687,243, filed on Oct. 13, 2000, now Pat. No. 6,699,128.

(51) Int. Cl.
*A63F 9/24* (2006.01)

(52) U.S. Cl. ............................................. 463/46

(58) Field of Classification Search .................. 292/36, 292/40; 463/16–20, 46, 47
See application file for complete search history.

(56) References Cited

U.S. PATENT DOCUMENTS

| | | | | |
|---|---|---|---|---|
| 2,148,050 | A | * | 2/1939 | Moseley ........................ 292/1 |
| 2,609,268 | A | * | 9/1952 | Nye ........................ 312/332.1 |
| 2,944,864 | A | | 7/1960 | Krivulka |
| 3,276,835 | A | * | 10/1966 | Hall ............................ 312/333 |
| 3,953,061 | A | * | 4/1976 | Hansen et al. .................. 292/5 |
| 4,015,866 | A | * | 4/1977 | Marsh et al. .................. 292/36 |
| 4,288,944 | A | * | 9/1981 | Donovan ...................... 49/395 |
| 4,470,277 | A | * | 9/1984 | Uyeda ........................... 70/118 |
| 4,601,499 | A | * | 7/1986 | Kim ............................. 292/36 |
| 4,922,734 | A | * | 5/1990 | Iannucci ........................ 70/58 |
| 5,011,198 | A | * | 4/1991 | Gruenberg et al. ............ 292/41 |
| 5,278,643 | A | * | 1/1994 | Takemoto et al. ........... 348/150 |
| 5,280,755 | A | * | 1/1994 | Batur ........................ 109/59 R |
| 5,288,161 | A | | 2/1994 | Graves et al. |
| 5,472,247 | A | * | 12/1995 | Monson ........................ 292/36 |
| 5,503,440 | A | * | 4/1996 | Peccoux ...................... 292/158 |
| 5,531,309 | A | * | 7/1996 | Kloss et al. .................. 194/202 |
| 5,697,234 | A | * | 12/1997 | Lozier et al. .................. 70/119 |
| 5,784,973 | A | * | 7/1998 | Mercer et al. ............. 109/59 R |
| 5,816,672 | A | * | 10/1998 | LaPointe et al. .......... 312/223.2 |
| 5,818,691 | A | | 10/1998 | McMahan et al. |
| 5,850,909 | A | | 12/1998 | Wagner |
| 5,911,763 | A | * | 6/1999 | Quesada ....................... 70/120 |
| 5,992,957 | A | | 11/1999 | Ecker et al. |
| 6,137,684 | A | | 10/2000 | Ayd et al. |
| 6,201,703 | B1 | * | 3/2001 | Yamada et al. .............. 361/752 |

(Continued)

*Primary Examiner*—Kim Nguyen
(74) *Attorney, Agent, or Firm*—Beyer Weaver & Thomas LLP

(57) ABSTRACT

A removable processor enclosure apparatus for use in a gaming machine having a housing defining an interior portion, and a first electrical connector disposed in the interior portion. The enclosure apparatus includes an enclosure containing the CPU electrical components therein, and is adapted for sliding receipt in the interior portion of the gaming machine housing between a mounting condition and a removal condition. In the mounting condition, the enclosure is mounted to the housing and electrically coupling a second electrical connector of the enclosure to the first electrical connector of the housing. In the removal condition, the enclosure can be removed from the housing. A release device is interengaged between the housing and the enclosure, and is selectively movable between a first position, locking the enclosure in the mounting condition, and a second position, releasing the enclosure from the mounting condition to the removal condition and disconnecting the second electrical connector from the first electrical connector.

19 Claims, 16 Drawing Sheets

U.S. PATENT DOCUMENTS

| | | |
|---|---|---|
| 6,391,258 B1 * | 5/2002 | Peake et al. .................. 422/26 |
| 6,434,652 B1 | 8/2002 | Bailis et al. |
| 6,439,996 B1 | 8/2002 | LeMay et al. |
| 6,442,021 B1 | 8/2002 | Bolognia et al. |
| 6,483,107 B1 | 11/2002 | Rabinovitz et al. |
| 6,515,854 B1 | 2/2003 | Claprood |
| 6,515,855 B1 | 2/2003 | Removedummy |

* cited by examiner

MODULAR CPU ENCLOSURE FOR GAMING MACHINES

CROSS REFERENCE TO RELATED APPLICATIONS

This application is a divisional of and claims priority to U.S. patent application Ser. No. 09/687,243 entitled "MODULAR CPU ENCLOSURE FOR GAMING MACHINES," filed on Oct. 13, 2000, and now issued as U.S. Pat. No. 6,699,128, which is incorporated by reference herein for all purposes.

BACKGROUND OF THE INVENTION

1. Field of Invention

The present invention relates to gaming machines such as slot machines or video poker machines. More particularly, the present invention relates to enclosures applied to protect the primary electrical components operating the gaming machines.

2. Description of the Prior Art

As technology in the gaming industry progresses, the once traditional mechanically-driven reel slot machines have been replaced with electronic counterparts having CRT video displays or the like. These video/electronic gaming advancements enable the operation of more complex gambling games, which would not otherwise be possible on mechanical-driven gambling machines. For example, in addition to reel slot machines, it is now common to observe stand alone or multiple platform video electronic games including Keno, Blackjack, Poker, Pai Gow, and all the variations thereof, in even the smallest gaming establishments. These electronic game devices may comprise numerous internal electrical components including, for example, a power supply, a lighted display and a Central Processing Unit (CPU).

The CPU, which generally controls the parameters and features of the game being played (E.g., the type of game and its pay-out), is one of the most critical components of the gaming device. Accordingly, it is imperative to prevent unauthorized access to avoid CPU tampering.

In most current configurations, the CPU is attached to a motherboard which in turn is mounted to the gaming machine through a sliding tray. This tray is then manually mounted into the gaming machine where the corresponding electrical connectors are mated for operation thereof. As can be appreciated, by sliding the tray in and out, the CPU may be serviced, replaced or otherwise accessed.

One problem associated with this design, however, is that the forces required to simultaneously connect and disconnect these connectors can be substantial. By way of example, each connector pin and corresponding socket of the mating connectors may require forces of up to ¼ lb each to connect or disconnect the respective pin. Therefore, in some instances, forces in excess of about 50 lbs. may be needed to connect and/or disconnect a 200 pin connector. Insertion and removal of the CPU tray, consequently, may be difficult during routine maintenance. In some instances, the pins/connectors may be damaged (e.g., bent) during forced manipulation, while in other instances injuries may occur during tray insertion and removal.

Another problem associated with this design is that the CPU tray may be inadvertently removed while the motherboard and the CPU are still powered. Known as hot swapping, in some cases, arcing can occur between the powered connectors which can damage the contacts and/or pins. In the worst case scenario, a fire or a significant amount of internal component damage can occur.

In view of the foregoing, it would be desirable to provide a modular enclosure for the CPU and other critical electrical components of the gaming device which protects these components from tampering, while further facilitating interconnection to the gaming machine

SUMMARY OF THE INVENTION

The present invention is therefore directed to an electronic gaming machine which includes a housing defining an interior portion, and a first electrical connector disposed inside the housing. A modular electronic enclosure is arranged to securably enclose the electrical components essential to the operation of the gaming machine therein. This enclosure is further adapted to be received in the housing interior portion between a mounting condition and a removal condition. In the mounting condition, the modular enclosure is mounted to the housing in a manner electrically connecting a second electrical connector of the primary electrical components with the first electrical connector. In the removal condition, the enclosure may be released to enable removal of the modular enclosure therefrom and electrically disconnecting the second electrical connector from the first electrical connector.

In one embodiment, to facilitate release of the modular electronic enclosure, a release device cooperates between the modular enclosure and the housing, and is selectively movable between a first position and a second position. In the first position, the release device locks the modular enclosure in the mounting condition, and in the second position, the release device releases the modular enclosure from the mounting condition for movement toward the removal condition The release device includes a cam portion interengaged between the modular enclosure and the housing to facilitate insertion and disengagement of the second electrical connector into and from the first electrical connector. The cam portion further aids movement of the modular enclosure toward the mounting condition as the release device is moved toward the first position and, aids movement of the modular enclosure toward the removal condition as the release device is moved toward the second position.

In another aspect of the present invention, a removable processor enclosure apparatus is provided for use in a gaming machine, which includes an enclosure securably containing the CPU electrical components in an interior space thereof. The enclosure is adapted for sliding receipt in the interior portion of the gaming machine housing between a mounting condition, mounting the enclosure to the housing and electrically coupling a second electrical connector of the enclosure to the first electrical connector of the housing, and a removal condition, enabling removal of the enclosure from the housing. The enclosure further includes a door movably mounted between an open position and a closed position. In the opened position, access is allowed to the interior space, while in the closed position, access is prevented to the interior space. A lock mechanism cooperates between the door and the enclosure to prevent movement of the door from the closed position to the open position.

In one embodiment, a release device is provided interengaged between the gaming machine housing and the enclosure, and selectively movable from a first position, locking the enclosure in the mounting condition, and a second position, releasing the enclosure from the mounting condition to the removal condition and disconnecting the second electrical connector from the first electrical connector. The release device is preferably positioned in the interior of the enclosure, so that when the door is in the closed position, it is operably inaccessible. However, when the door is in the opened condition, the release device is accessible, and can be operated to remove the entire enclosure.

In still another aspect of the present invention, a modular processor enclosure apparatus for use in a gaming machine. The gaming machine includes a power source and a first electrical connector disposed in the interior portion of the housing. The enclosure apparatus includes an enclosure containing the CPU electrical components therein, and is adapted for sliding receipt in the interior portion of the gaming machine housing between a mounting condition and a removal condition. In the mounting condition, the enclosure is mounted to the housing in a manner electrically connecting a second electrical connector of the enclosure to the first electrical connector of the housing. In the removal condition, the enclosure may be removed from the housing in a manner electrically disconnecting the second electrical connector of the enclosure from the first electrical connector of the housing. A sensor device is configured to couple the power source to the electrical components when the housing is in the mounting condition and to decouple the power source from the electrical components when the modular enclosure is moved from the mounting condition toward the removal condition. This electrical decoupling occurs prior to the electrical disconnection of the second electrical connector from the first electrical connector.

In this configuration, a release device may be included which is interengaged between the gaming machine housing and the enclosure. The release device is selectively movable from a first position, locking the enclosure in the mounting condition, and a second position, releasing the enclosure from the mounting condition to the removal condition and disconnecting the second electrical connector from the first electrical connector. Preferably, the sensor device is configured to cooperate with the release device to activate power to the power source when the release device is moved to the first position, and to decouple the power source from the electrical components when the release device is moved toward the second position

BRIEF DESCRIPTION OF THE DRAWINGS

The assembly of the present invention has other objects and features of advantage which will be more readily apparent from the following description of the best mode of carrying out the invention and the appended claims, when taken in conjunction with the accompanying drawing, in which:

DETAILED DESCRIPTION OF THE INVENTION

Figure 1:
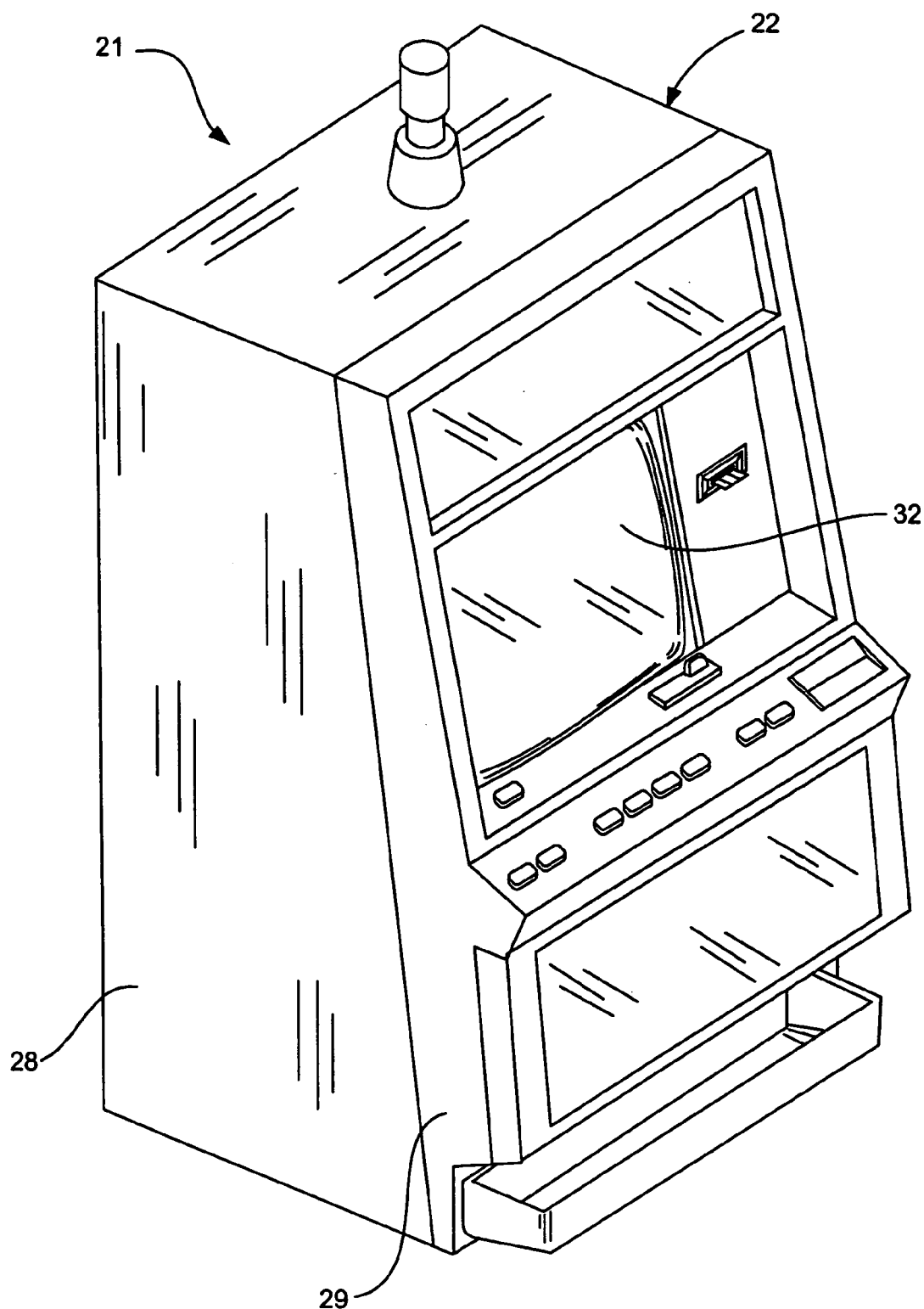
FIG. 1 is a top perspective view of a gaming machine incorporating the CPU enclosure of the present invention.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various Figures.

Figure 2:
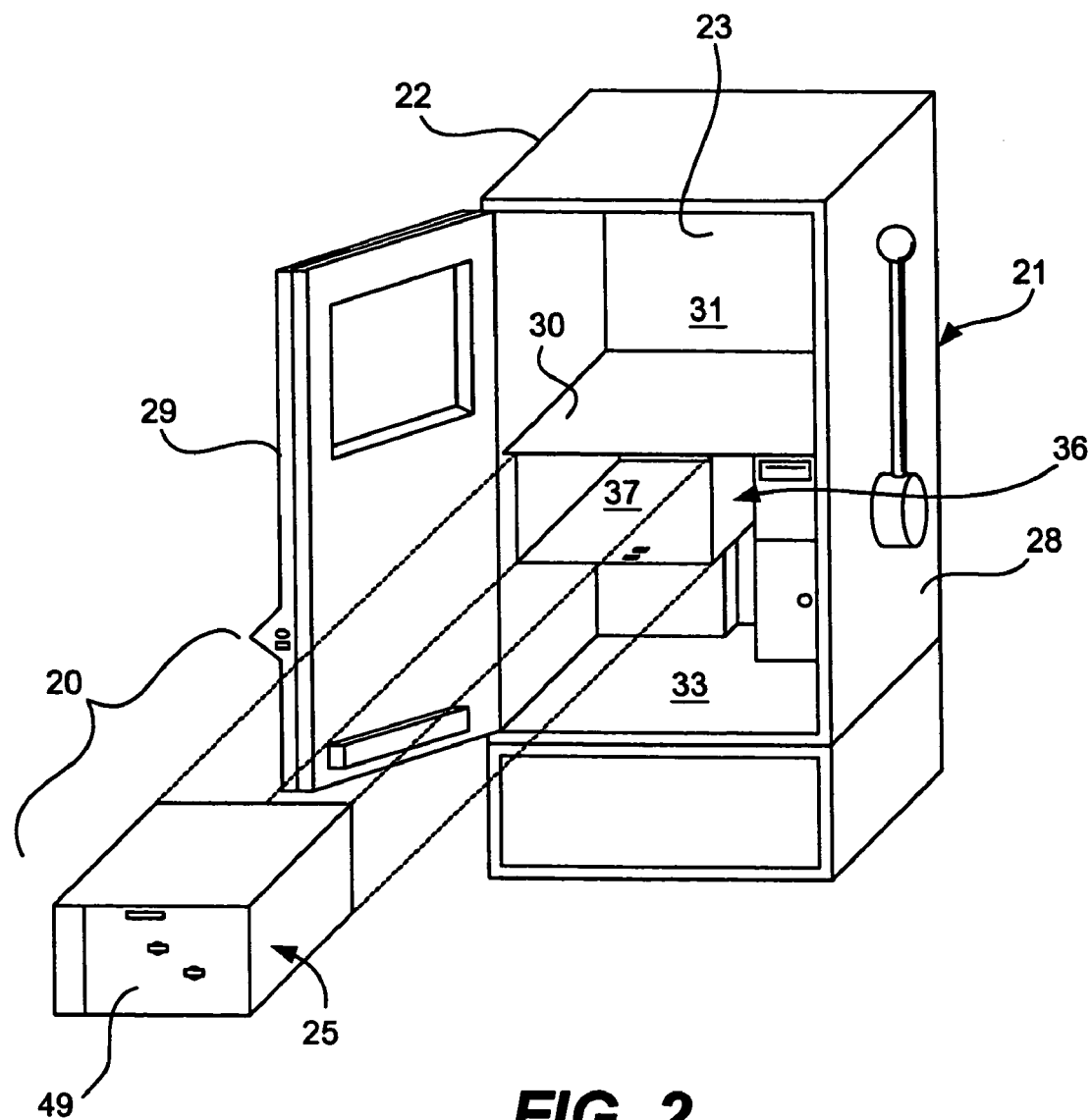
FIG. 2 is a reduced, top perspective view of the gaming machine in FIG. 1, and illustrating the CPU enclosure constructed in accordance with the present invention.
Figure 3:
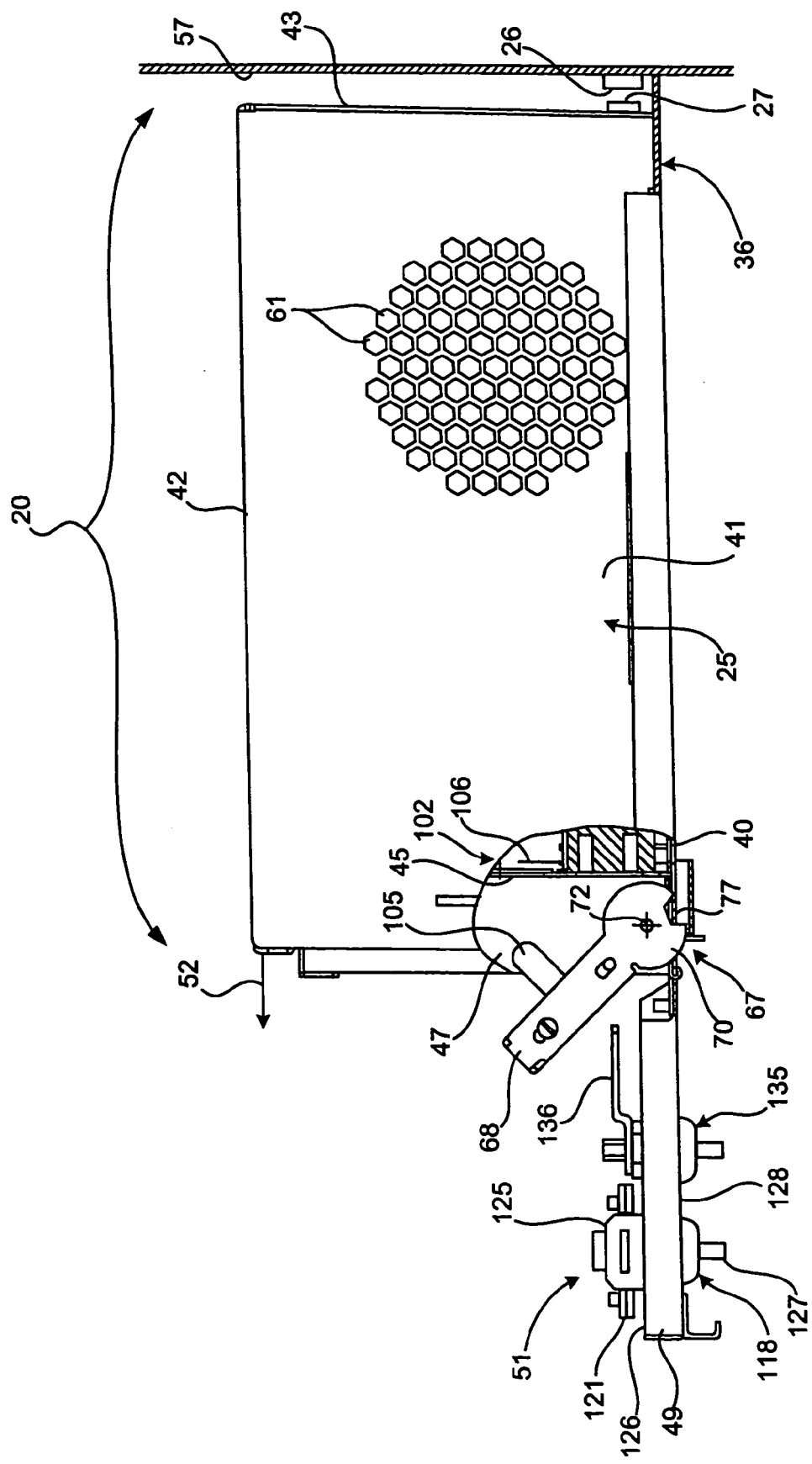
FIG. 3 is an enlarged, fragmentary, side elevation view of the CPU enclosure of FIG. 2 illustrated in a removal condition.
Figure 4:
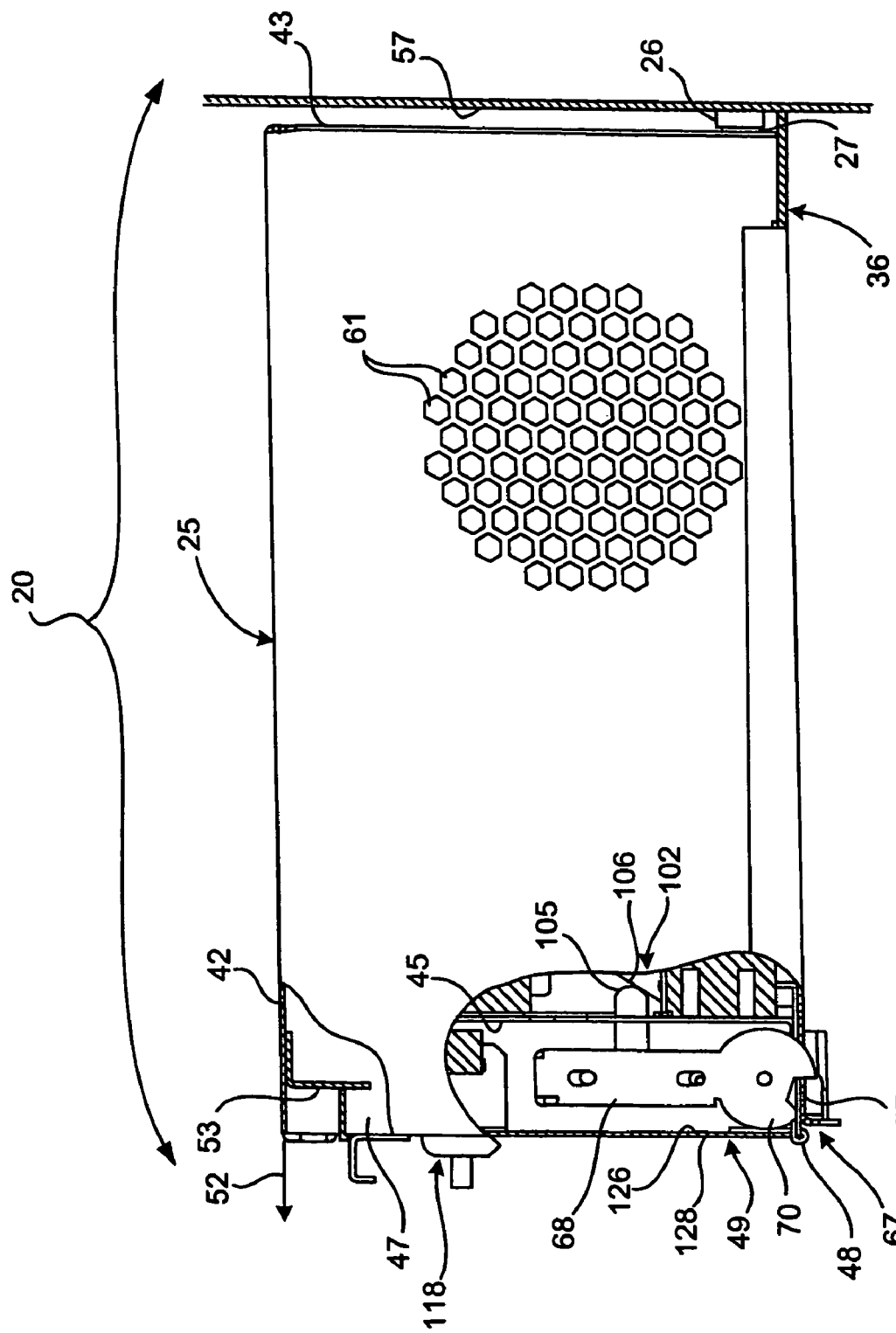
FIG. 4 is a fragmentary, side elevation view of the CPU enclosure of FIG. 3 in a mounted condition.
Figure 5:
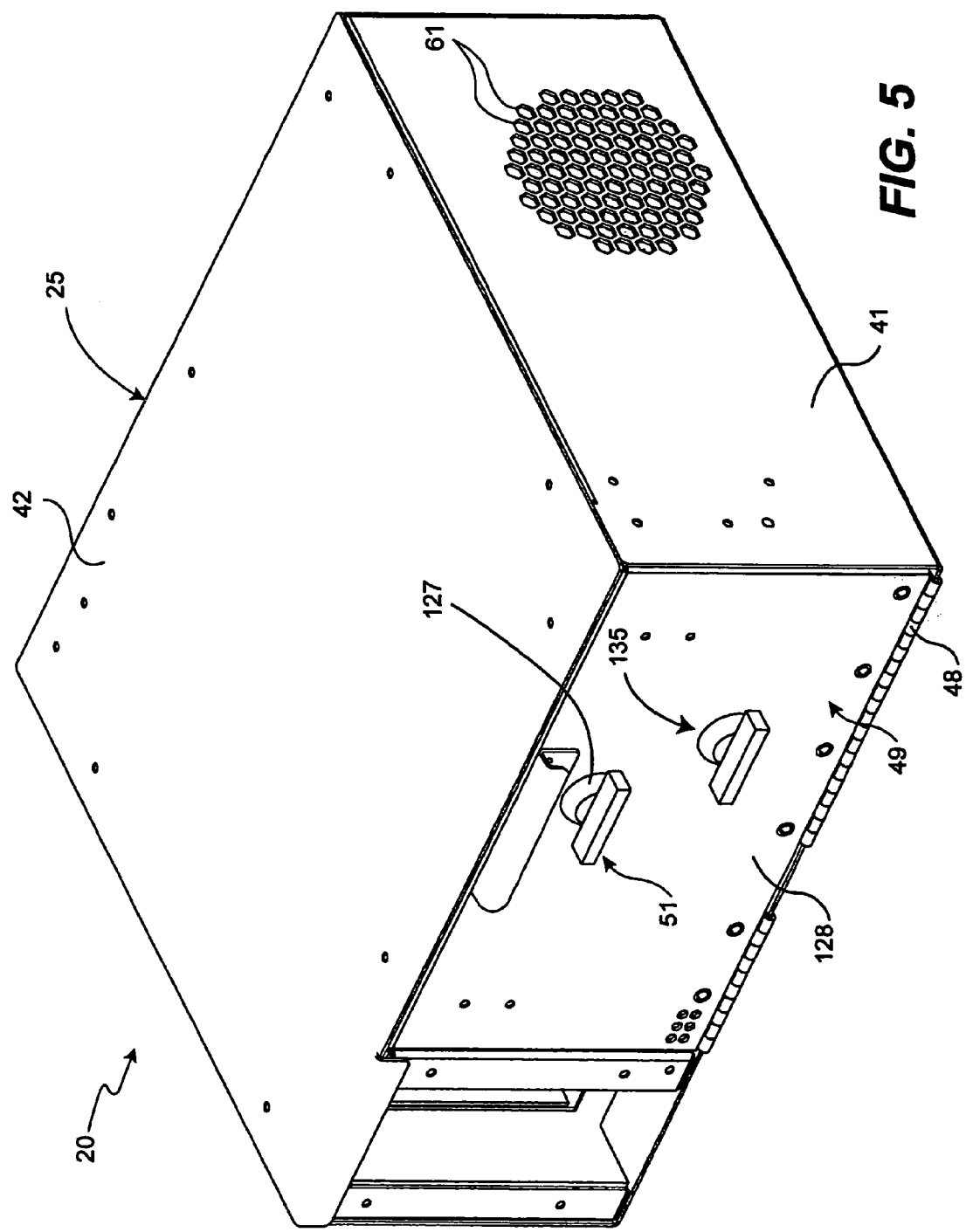
FIG. 5 is a top perspective view of the CPU enclosure of FIG. 2, having a door in a closed position.

Attention is now directed to FIGS. 1–7 where the present invention modular enclosure apparatus, generally designated 20, is illustrated for use in a video gaming machine 21. These conventional gaming machines include a housing 22 defining an interior portion 23 therein, and a first electrical connector 26 disposed in the interior portion 23. A Central Processing Unit (CPU) enclosure, generally designated 25, is provided securably containing the CPU electrical components therein. This enclosure is further adapted for sliding receipt in the interior portion 23 of the gaming machine housing 22 between a removal condition (FIG. 3) and a mounting condition (FIG. 4). In the mounting condition, the enclosure 25 is mounted to the housing 22 in a manner electrically coupling a second electrical connector 27 of the enclosure 25 to the first electrical connector 26 of the housing 22. In the removal condition, the enclosure 25 can be removed from the housing 22, and the second electrical connector 27 is disconnected from the first electrical connector 26 during removal.

Accordingly, a secured enclosure is provided for the CPU (not shown) and other primary electrical components essential to the CPU and to the gaming machine, which may be easily connected and disconnected to and from the machine. This design, thus, is configured to be a modular component which facilitates simple replacement and removal of the unit. Moreover, this assembly substantially reduces unauthorized access to these primary electronic components while the enclosure is mounted in the gaming machine. Modularity also provides several other competitive advantages such as the ease of assembly and servicing. For example, modules requiring repair or replacement can be easily exchanged, thereby significantly reducing servicing down-time. Additionally, other games which are functional on the same game machine platform can be easily introduced by interchanging the CPU enclosure.

Figure 9:
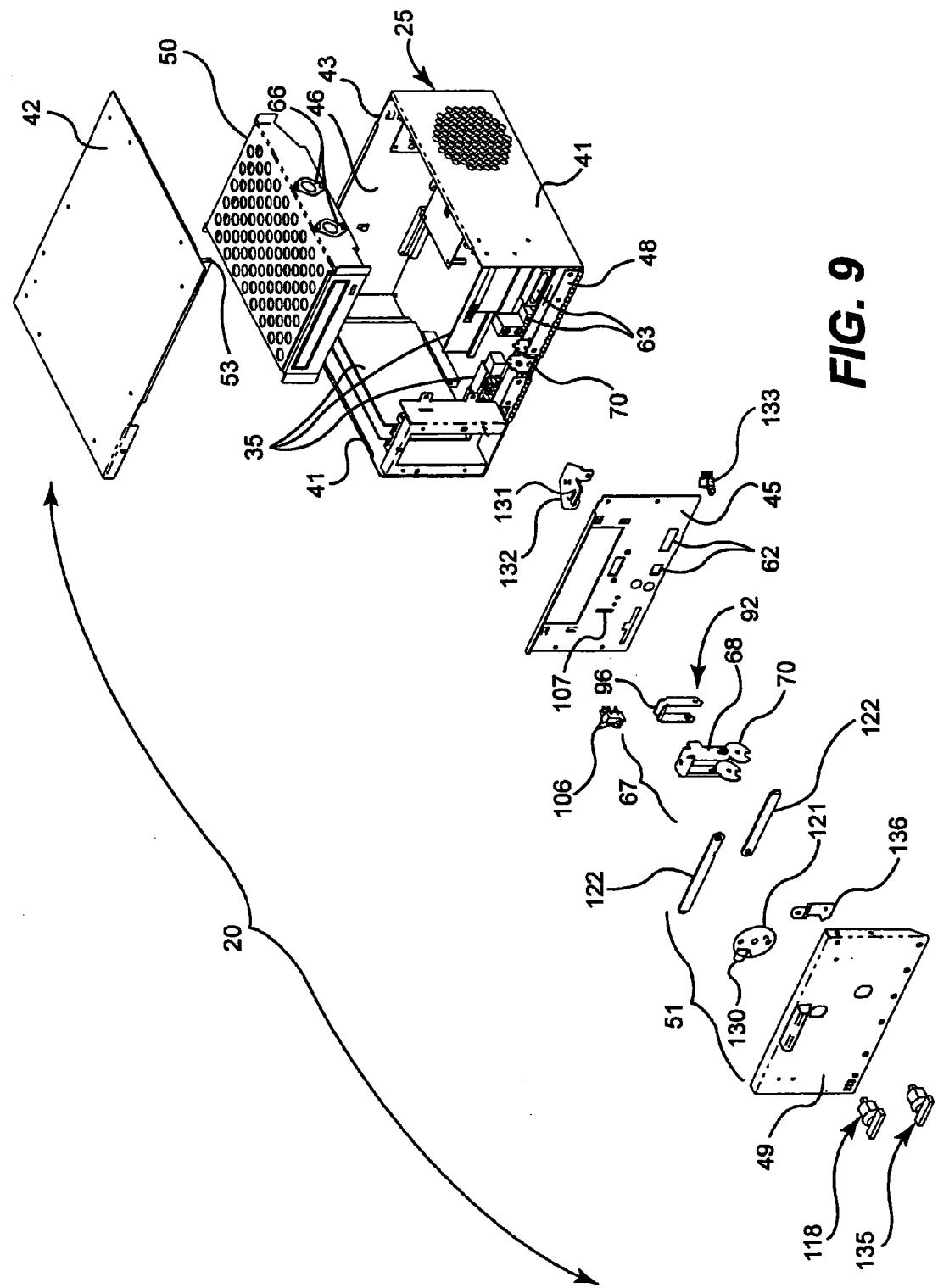
FIG. 9 is a reduced, exploded view, of the CPU enclosure of FIG. 5.

As shown in FIGS. 1, 2, and 9, the gaming machine housing 22 is illustrated including a main cabinet 28 and a cabinet door 29 (shown in its open position in FIG. 2) enabling access to the interior portion 23. A conventional cabinet locking device (not shown) locks the cabinet door 29 to the main cabinet 28 to prevent unauthorized access by gaming patrons. Briefly, the housing 22 may include an upper shelf 30 forming a monitor compartment 31 dimensioned to receive and support a display monitor 32 therein. Positioned below the upper shelf 30 is a lower compartment 33 containing other essential gaming machine electronic components 35 therein. Further included in the lower compartment 33 is an enclosure support member 36 mounted to the housing 22, and adapted for sliding receipt and support of the CPU enclosure 25 therein. In this arrangement, the CPU enclosure 25 is slidably supported in the support member 36 between the mounting condition (FIG. 4), mountably securing the enclosure to the support member of the housing 22 in a manner electrically coupling a second electrical connector 27 of the enclosure 25 to the first electrical connector 26, and the removal condition (FIG. 3), enabling removal of the enclosure 25 from the housing 22, and the second electrical connector 27 is disconnected from the first electrical connector 26 during removal.

The enclosure support member 36 is generally in the shape of a rectangular sleeve which defines a pocket 37 accessible through a front opening thereof. This rectangular dimension, however, may vary according to the specific design of each gaming system. The pocket 37 is sized and dimensioned slightly larger than the rectangular transverse cross-sectional dimension of the CPU enclosure 25 for sliding mating alignment between the first electrical connector 26 positioned at the rear of the support member 36 and the second electrical connector positioned at the rear of the CPU enclosure 25 (FIG. 4). Such sliding alignment may be provided by conventional alignment techniques.

Briefly, the CPU enclosure 25 generally contains the CPU (not shown) and other essential electrical components necessary for controlling the game operation during play. In addition to the CPU, for instance, other essential components may include integrated circuit chips and other circuitry to provide computing operations associated with operating the gaming machine 21. The integrated circuit chips and other circuitry may include a microprocessor, memory components (e.g., Read-Only Memory (ROM), Random-Access Memory (RAM)), a disk drive, CD-Rom or DVD storage medium, a battery, various input/output (I/O) support circuitry and the like.

When the CPU enclosure is operably mounted to the support member 36 in the mounting condition, the input and output connections of these components will be reliably connected with the corresponding connections of the gaming machine (i.e., through the first and second electrical connectors). By way of example, the gaming machine display 32, as well as the various player input switches, buttons, etc, for selecting options associated with the game being played will be interconnected with the CPU. This enables the play, operation and control of any video game such as Slots, Keno, Blackjack, Poker, Pai Gow or the like.

Although the gaming machine has been described and shown in context of a conventional upright gaming machine, it should be understood that other gaming machine cabinet designs may be used which are well known in the art. These may include, but are not limited to, slant top gaming machines, flat top gaming machines, such as bar table gaming machine. It should also be noted that, while not specifically shown, this gaming machine platform typically includes all the other conventional gaming machine components that are either internal or external to the main cabinet. These include, for example, a bill validator, a coin hopper, a lock enclosure, and a power supply, which may be located within the main cabinet, and a coin/bill acceptor and a card reader, a lighted display and a sound system.

Turning now to FIGS. 3–5, 8 and 9, the CPU enclosure 25 will be described in detail. The CPU enclosure 25 generally includes a secured rectangular enclosure structure which is adapted to secure and enclose the essential CPU electrical components 35 in an interior compartment 46 thereof. The enclosure 25 includes two opposed side walls 41, a base plate 40, which encloses the bottom of the CPU enclosure 25, and a top plate 42, which encloses the top of the CPU enclosure 25. At the rear of the enclosure is a back plate 43, supporting the second electrical connector 27. A front plate 45 separates the interior compartment 46 from a front access space 47, as will be discussed below.

Enclosing the front access space 47 is a front door 49 which is coupled to the enclosure 25 between a closed condition (FIGS. 4 and 5), preventing access to front access space 47 of the CPU enclosure, and an opened condition (FIGS. 3 and 8), enabling access to front access space. Preferably, the front door 49 is pivotally mounted to the base plate 40 of the enclosure 25 through a hinge mechanism 48. This enables the door 49 to selectively rotate between the opened position and closed position with respect to the enclosure 25. Once the door 49 is moved to the opened condition, selected components contained within the front access space of the CPU enclosure 25 become accessible such as a disk or CD/ROM drive 50, selected input/output connectors and the like. As will be discussed, a lock mechanism 51 is disposed between the door 49 and the enclosure structure to prevent unauthorized access through the door to the enclosure front access space.

The top plate 42 is removably mounted to the enclosure 25 to provide physical access into the internal components housed inside the CPU enclosure 25. However, the top plate 42 is slideably mounted to the enclosure, and may only be slideably removed, in the direction of arrow 52 in FIGS. 3 and 4, when the door 49 is in the opened condition, and when the CPU enclosure is moved to the removal condition. This concept prevents unauthorized removal of the top plate 42 when the enclosure 25 is in the mounting condition.

First, the top plate 42 includes a front lip portion 53 which depends downwardly into the front access space 47 (FIGS. 4 and 9). When the door 49 is positioned in the closed condition, the lip portion 53 is arranged to impact the door 49 which interferes with the sliding movement in the direction of arrow 52. As shown in FIG. 3, however, once the door 49 is rotated to the opened condition, such interference with the front lip portion 53 is removed and the top plate will be free to slideably move in the direction of arrow 52.

Figure 6:
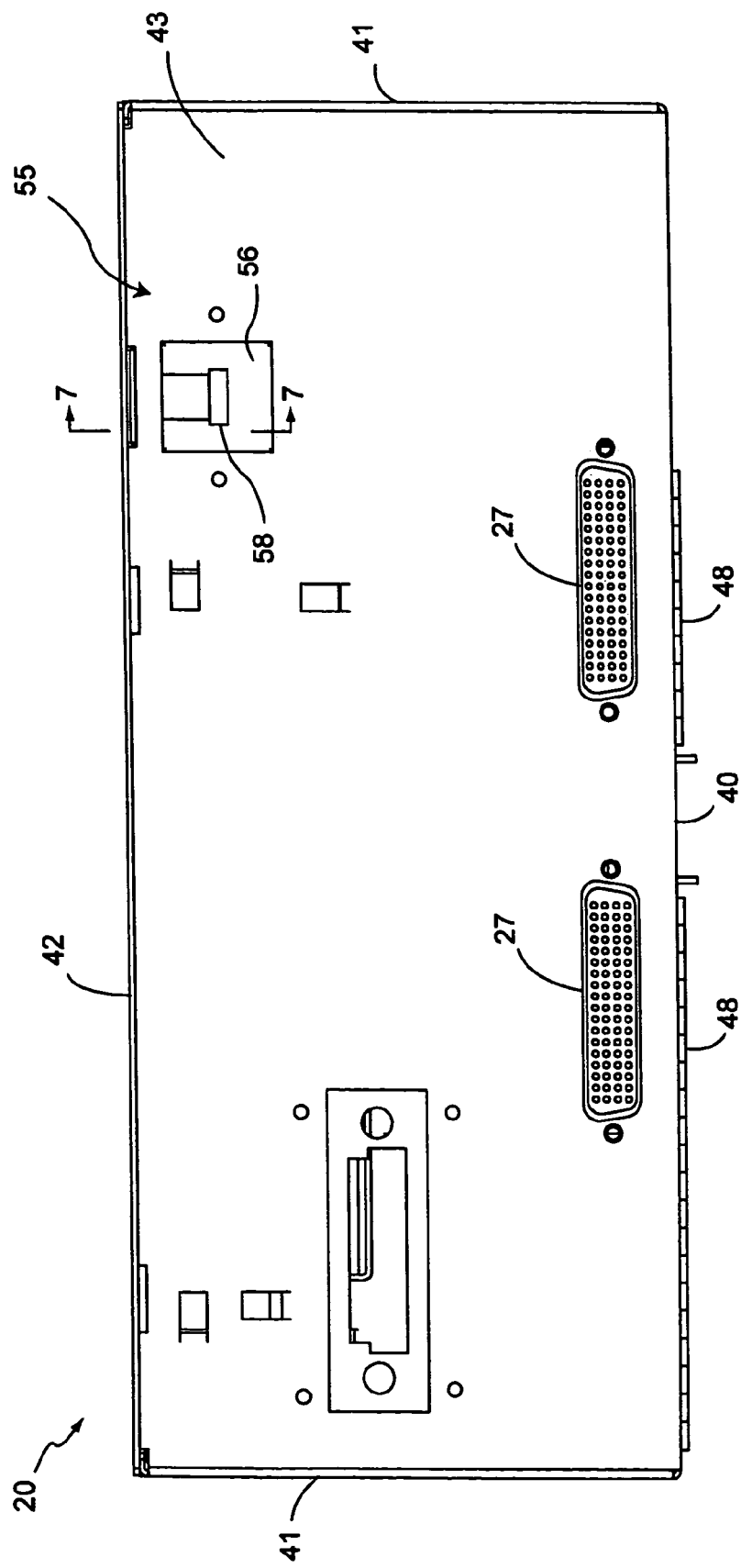
FIG. 6 is a rear plan view of the CPU enclosure of FIG. 2.
Figure 7:
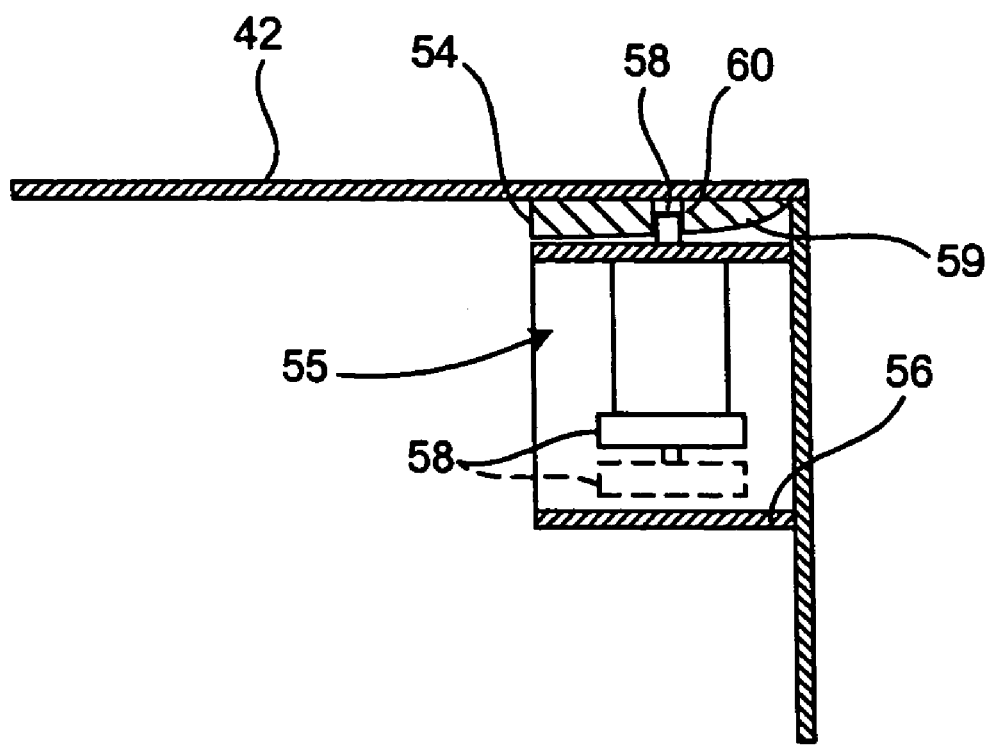
FIG. 7 is an enlarged, fragmentary, side elevation view of a securing device taken substantially along the plane of the line 7—7 in FIG. 6.

Secondly, referring now to FIGS. 6 and 7, a securing device 55 is provided which releasably secures the top plate 42 to the enclosure 25. As shown, this securing device 55 is positioned at the back plate 43 of the enclosure, and is disposed in a recess 56 thereof. Thus, when the CPU structure 38 is mounted to the support member 36 in the mounted condition (FIG. 4), the proximity of the back wall 57 of the support member 36 and the back plate 43 of the enclosure 25 prevent operable access to the securing device 55.

The securing device 55 includes a pin plunger 58 secured to the enclosure 25 which is biased toward an engaging position (FIG. 7) securely engaging the top plate 42. To retain the top plate 42, a ramp plate 54 is included on the bottom side thereof which defines a pin slot 60 strategically placed to receive the pin plunger when the top plate 42 is fully slid onto the enclosure 25. Accordingly, the pin plunger 58 must be manually withdrawn from the pin slot 60 (shown in phantom lines in FIG. 7) to enable release of the top plate. It will further be appreciated that the ramp plate 54 includes a ramp portion 59 which is configured to depress the pin plunger 58 until the pin plunger is received and engaged in the pin slot 60 when the top plate is slideably remounted to the enclosure 25.

In accordance with one aspect of the enclosure device, selected walls thereof are preferably arranged to reduce the transmission of electronic emissions into and out of the CPU enclosure 25. This arrangement shields electronic emission sensitive components from such harmful emissions. In some instances, the internal electrical components in the CPU enclosure 25 may themselves generate these emissions, while in others cases, the emissions may be generated by the electrical components of adjacent gaming machines or any other piece of electronic equipment. In order to effectively reduce electronic emission exposure, the enclosure 25 is configured to fully enclose the CPU and other electronic components of the CPU enclosure 25. The opposed side walls 41 define a plurality of apertures 61 extending therethrough to provide a ventilation pathway to cool the internal components contained in the CPU enclosure 25. In the preferred form, the apertures 61 are hexagonal in design, and are generally equally spaced-apart. This array of aligned apertures 61 cooperate to facilitate attenuation of the electronic emissions. Such designs are set forth in the Instrument Specialties, Inc. catalog, 1999. Another technique employed to reduce emission exposure is to compose the enclosure 25 from a suitable shielding material, such as eighteen (18) gauge sheet metal.

As above-indicated, the front access space 47 of the CPU enclosure 25 provides limited access to selected components contained therein. In the illustrated embodiment, the front access space 47 is formed between the door 49, in the closed position, and a front plate 45 disposed between the back plate 43 and the door 49. The front plate 45 further cooperates with a portion of the base plate 40, a portion of the top plate 42, and a portion of at least one of the side walls 41 to not only define the front access space 47, but to further prevent unauthorized access to the interior compartment 46 of the enclosure 25. Accordingly, when the door is moved to the opened condition (FIGS. 3 and 8), the front access space 47 is accessible, while the interior compartment 46 remains inaccessible. In most configurations, the front plate 45 is positioned in close proximity to the cabinet door 29 of the housing 22 for easy access thereto without removing the CPU enclosure 25 from the gaming machine 21.

As shown, the front plate 45 includes a plurality of openings 62 therethrough to provide limited access to selected electrical connectors 63 suitable for connection to external peripheral devices (e.g. network, computer, electronic key, disk drives, key board, monitor, mouse and the like). This arrangement enables the uploading and/or downloading of information between an external device (not shown) and the electrical components housed inside the CPU enclosure 25. In the preferred embodiment, at least one of the external connectors 63 may be dedicated as an electronic key which allows electrical access to the essential electronics inside the CPU enclosure 25. Such external connectors 63, for instance, may include a serial port, a parallel port, a Universal Serial Bus (USB) port, an Ethernet port and the like. Thus, during maintenance or testing, a technician would only be required open the cabinet door 29, and move the front door 49 of the CPU enclosure to the opened condition to access these external connectors.

A further peripheral that may be directly accessible, in certain jurisdictions, in the front access space 47 is a CD/ROM drive 50 mounted to the front plate 45. Shock mounts 66 (FIG. 9) may be used to support the CD/ROM drive 50 within the CPU enclosure 25 in order to protect the drive from damage that may be caused by sudden shocks or vibrations. These conventional shock mounts 66 may also be used on other components contained inside enclosure 25 (e.g., hard drive). Particular advantages of a CD/ROM drive is the large amount of data that can be stored and the speed at which the stored data can be retrieved. Correspondingly, the CD/ROM drive 50 may be used to download software associated with the gaming machine 21 or run diagnostic software for determining problems. It should be understood, however, that this is not a limitation and that other types of computer readable media may be used (e.g., floppy, DVD ROM drive, hard disk drive, magneto-optical disk drive, and magnetic tape drive).

Referring now to FIGS. 3, 4 and 6, the back plate 43 is illustrated supporting the second electrical connectors 27 thereon. These connectors 27 are adapted to be mated with corresponding first electrical connectors 26 that are disposed inside the enclosure support member 36. Once the CPU enclosure 25 is slideably mounted to the enclosure support member 36, in the mounting condition, the first and second electrical connectors 27 are aligned and mated to one another for operable communication therebetween (FIG. 3) In this manner, the CPU enclosure 25 may be operatively coupled to electrical components of the gaming machine 21 when the CPU enclosure 25 is disposed inside the support member 36 in the mounting condition. Preferably, these electrical connectors may be provided by two 96 pin LFH style connectors. It should be noted, however, that the type and amount of connectors may vary according to the specific needs of each gaming system. For example, one connector or a plurality of connectors may be used, and other suitable connectors such as DIN, IEEE 1301, COMPACT PCI may be suitably employed.

In accordance with the present invention, the CPU enclosure 25 incorporates a release device, generally designated 67, which is adapted to facilitate the insertion and extraction of the CPU enclosure 25 relative to the gaming machine. More particularly, the release device 67 is interengaged between the enclosure 25 and the enclosure support member 36 to facilitate movement of the CPU enclosure 25 from the removal condition (FIG. 3) to the mounting condition (FIG. 4), which operably connects the second electrical connectors 27 of the CPU enclosure to the first electrical connectors 26 of the gaming machine, and from the mounting condition to the removal condition, which operably disconnects the electrical connectors 26, 27. This leverage arrangement is advantageous since, as mentioned above, the force required to connect and disconnect these multiple electrical connectors can be substantial.

Figure 8:
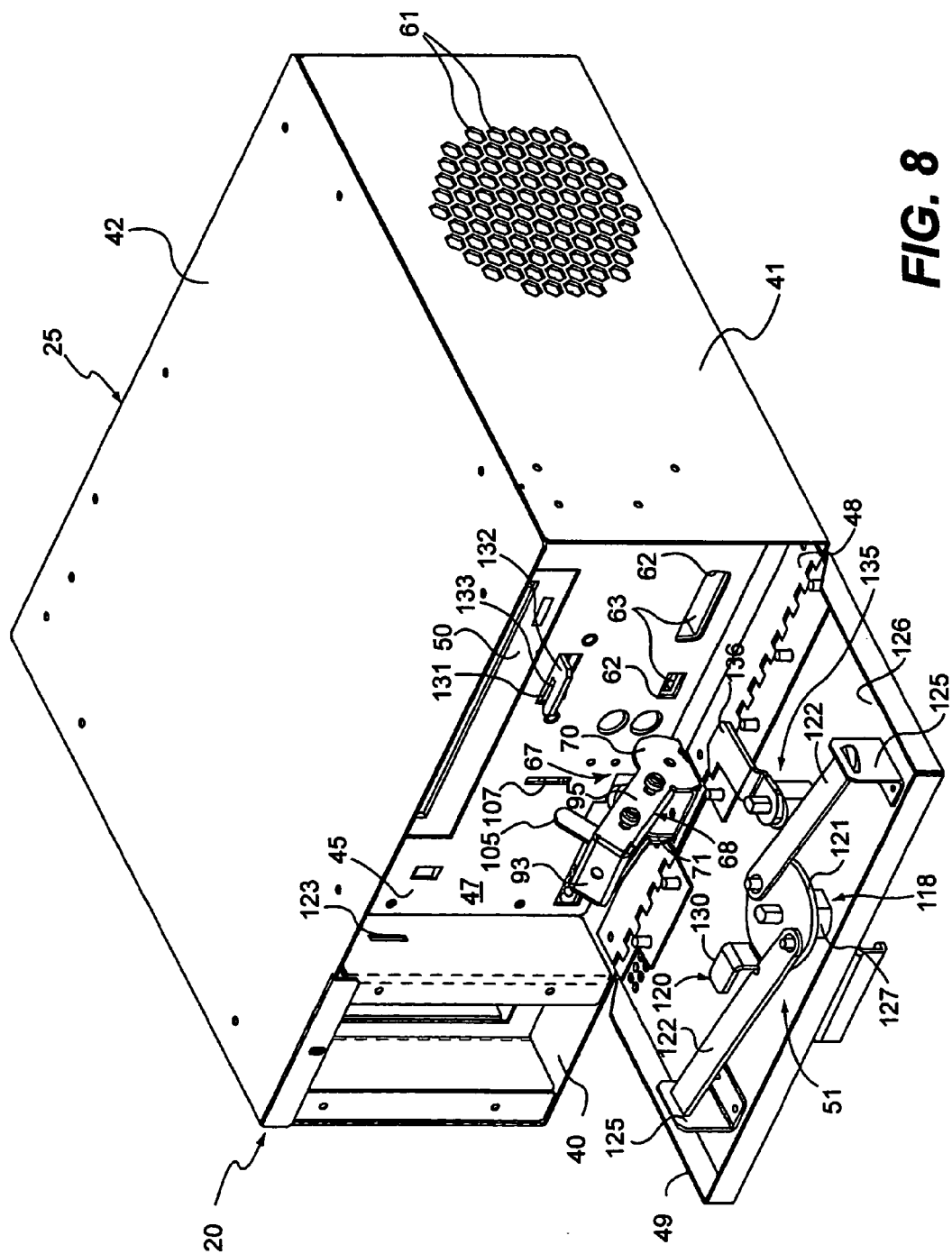
FIG. 8 is a top perspective view of the CPU enclosure of FIG. 5, having the door in an opened position.

As best viewed in FIGS. 3, 4 and 8, the release device 67 is disposed in the front access space 47 of the CPU enclosure 25 so that it cannot be manually operated when the front door 49 of the CPU enclosure is closed or locked. To operate the release device 67, in order to remove the CPU enclosure 25 from the enclosure support, the front door 49 of the CPU enclosure must be in the opened condition (FIGS. 3 and 8). In the preferred embodiment, the release device 67 cooperates between the modular enclosure 25 and the gaming machine housing 22 for selective manual movement between a first position (FIGS. 4 and 10D) and a second position (FIGS. 3, 6 and 10B). In the first position, the release device 67 locks the modular enclosure 25 in the mounting condition, while in the second position, the release device 67 releases the modular enclosure 25 from the mounting condition for movement toward the removal condition.

More preferably, FIGS. 3, 4 and 8 illustrate that the release device 67 includes a manually operable lever portion 68 and a cam portion 70 coupled to an end thereof. The cam portion 70 and lever portion 68 are rotatably coupled to a lever support 71, which is structurally attached to the base plate 40, for movement about a pivotal axis 72 between the first position and the second position. In the first position, as shown in FIG. 4, the lever portion 68 is oriented in a substantially upright position in the front access space 47 to enable closure of the door. In the second position, the lever portion 68 is rotated outwardly from the front access space 47 to the angled orientation shown in FIGS. 3 and 8.

When the release device 67 is rotated from the first position to the second position, the CPU enclosure 25 is urged partially out of the support member 36 as the enclosure moves from the mounting condition (FIG. 4) to the removal condition (FIG. 3). As a result, the second or CPU enclosure electrical connector 27 is operably disconnected from the first or gaming machine electrical connector 26. Conversely, when the release device 67 is rotated from the second position to the first position, the CPU enclosure 25 is urged from the removal condition to the mounting condition, electrically connecting the enclosure electrical connector 27 to the gaming machine electrical connector 26.

In accordance with the present invention, the release device applies the principles of leverage between the CPU enclosure and the support member 36 to generate a force sufficient to connect and disconnect the enclosure electrical connector 27 and the gaming machine electrical connector 26. This arrangement minimizes damage to the associated connector pins, while further reducing potential injury to maintenance personnel caused by the aforementioned connections.

Figure 10A:
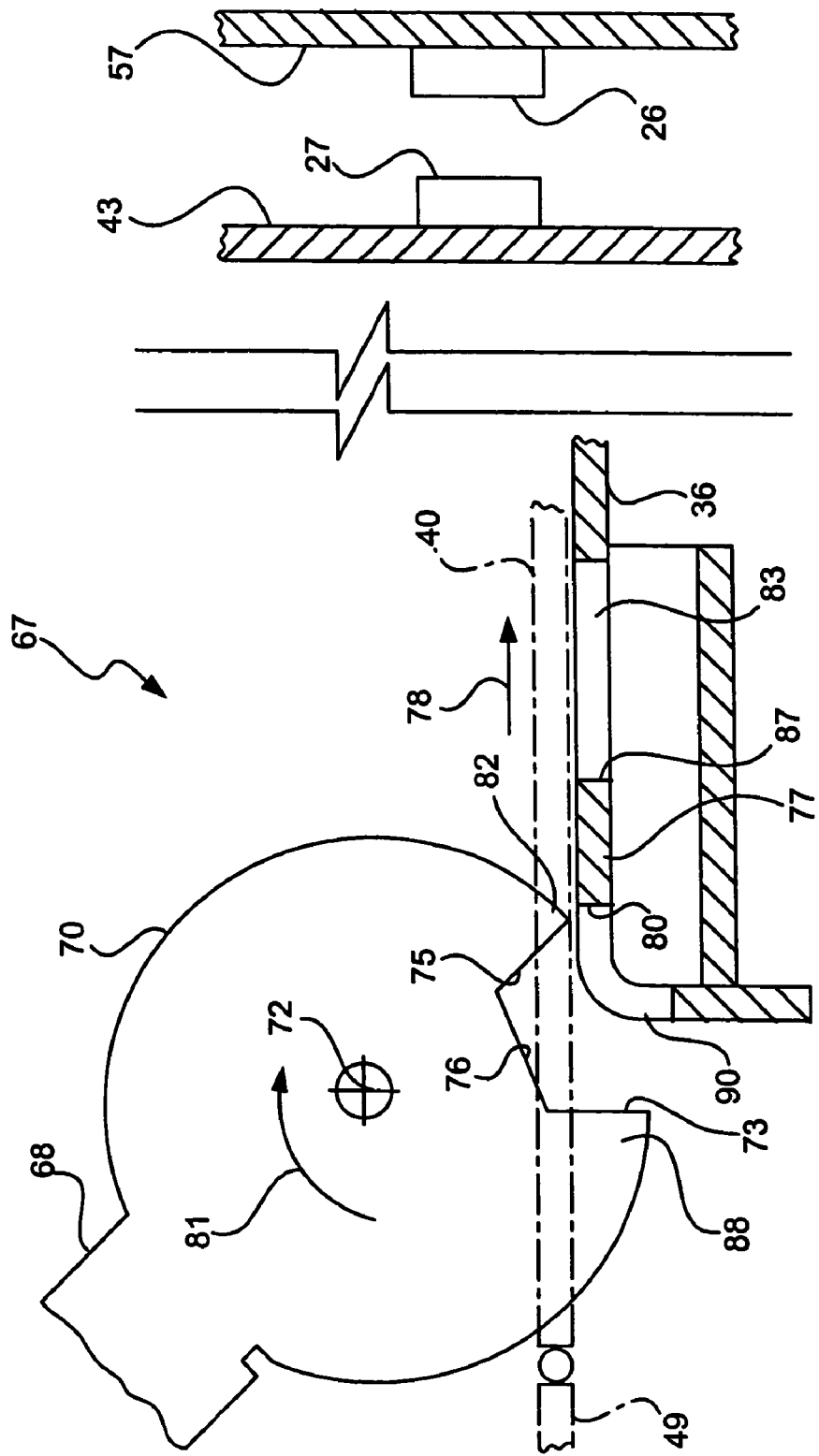
FIGS. 10A–10E is a sequence of enlarged, fragmentary, side elevation views of a release device of the present invention interengaging a tab member of the support member to connect the electrical connectors.
Figure 10B:
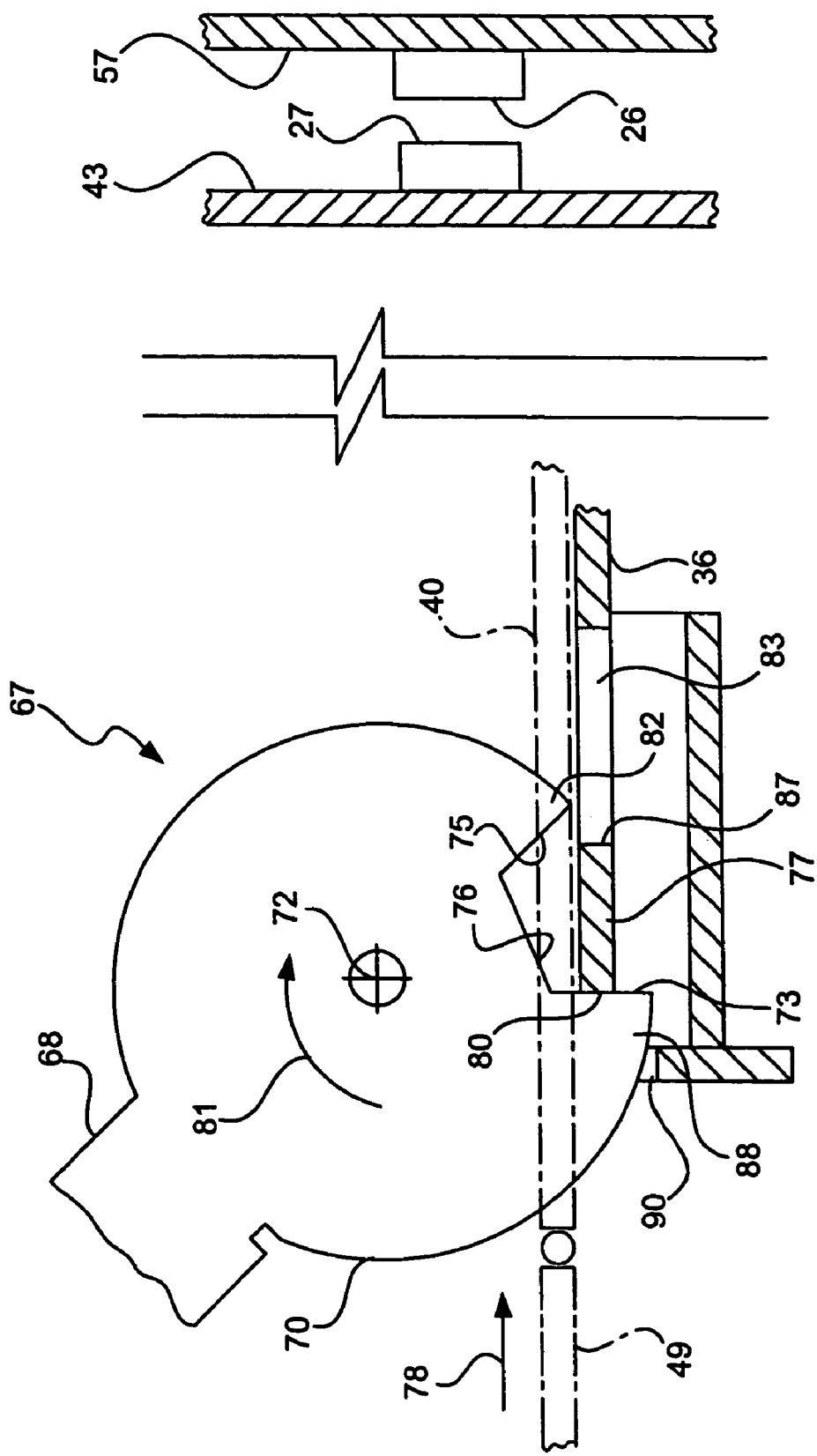

Referring now to FIGS. 10A–10E, the cam portion 70 of the release device 67 is illustrated including a first cam surface 73, and an opposed second cam surface 75, which collectively define a downwardly facing detent 76. When the release device 67 is oriented in the second position, this detent 76 is formed and positioned for receipt of a tab member 77 of the enclosure support member 36 as the CPU enclosure 25 is slid in the direction of arrow 78 into the pocket 37 of support member 36 (FIG. 10A). Such sliding movement continues until a first cam surface 73 of the cam portion 70 abuts against a first contact surface 80 of the tab member 77 in a "set position" of FIG. 10B.

Figure 10C:
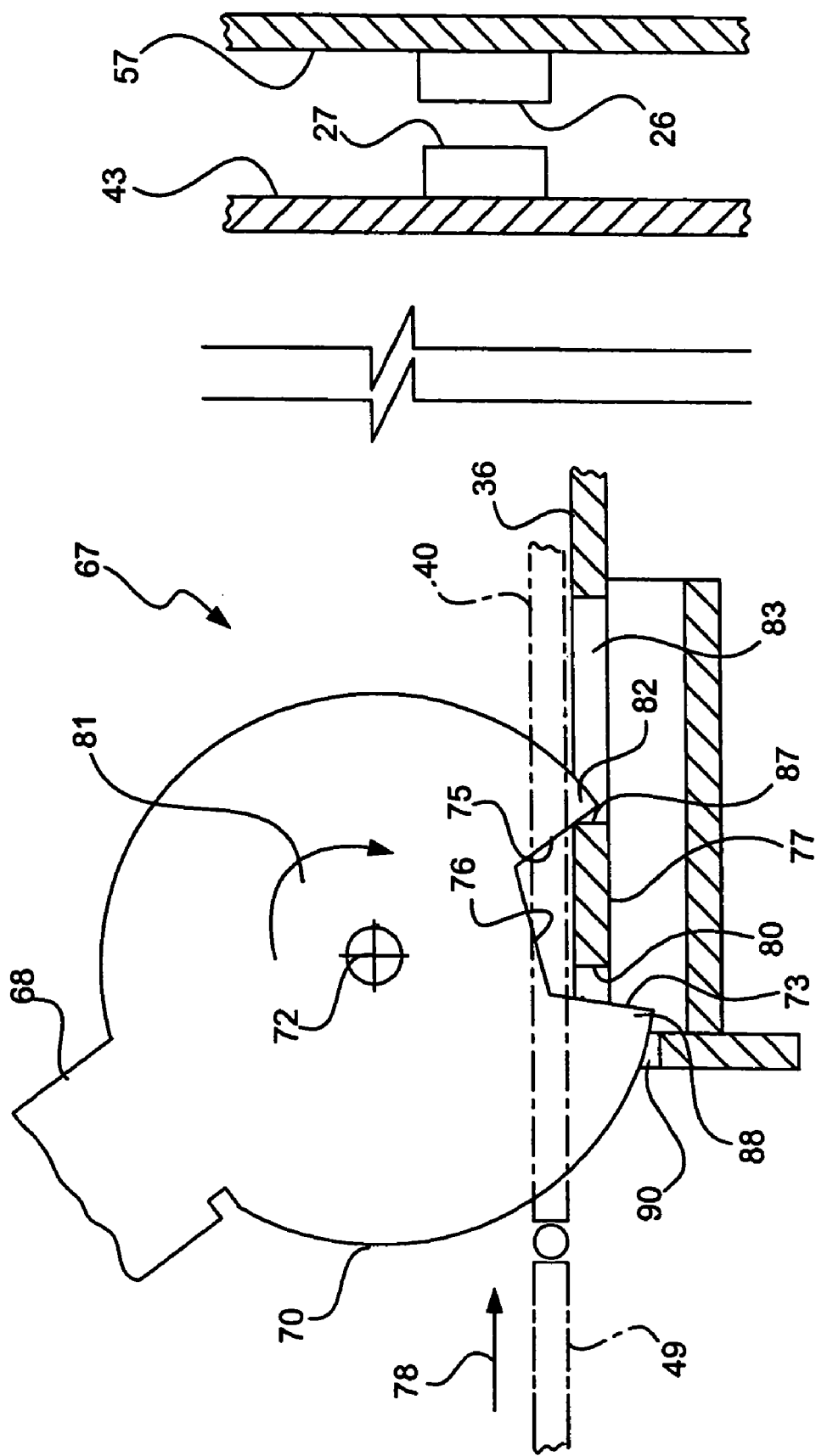

Once the CPU enclosure is retained in the "set position" of FIG. 10B, the lever portion 68 of the release device 67 can be manually rotated in the clockwise direction of arrow 81. As shown, a second tooth portion 82 is then received in a second opening 83 in the support member 36 until the second cam surface 75 contacts the second contact surface 87 of the tab member 77 (FIG. 10C). At this orientation, the second tooth portion 82 effectively prevents any uninterferred withdrawal of the CPU enclosure 25 from the pocket 37 of the enclosure support member 36 due to contact with the second contact surface 87 of the tab member 77.

Figure 10D:
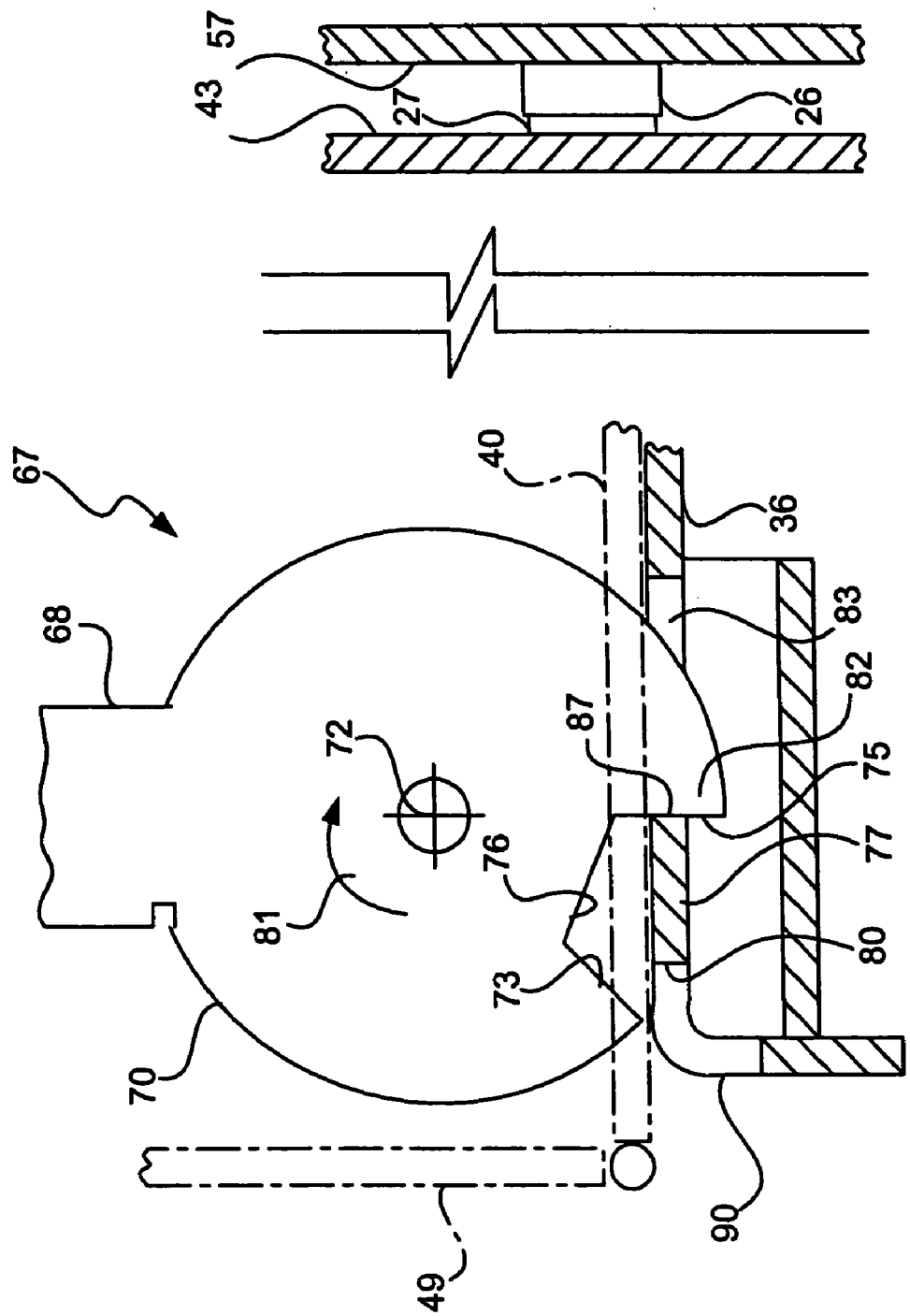
Figure 10E:
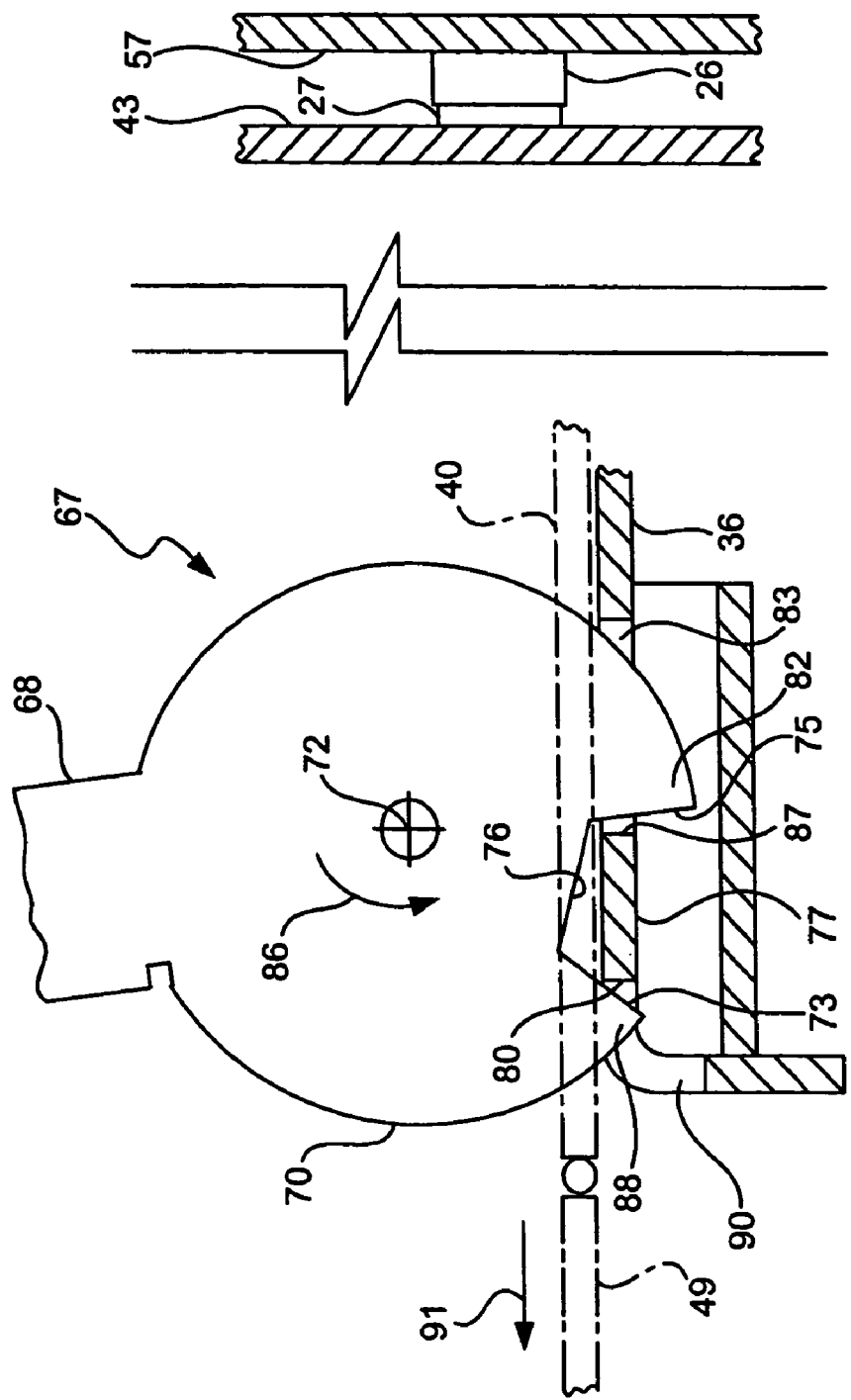
Figure 11:
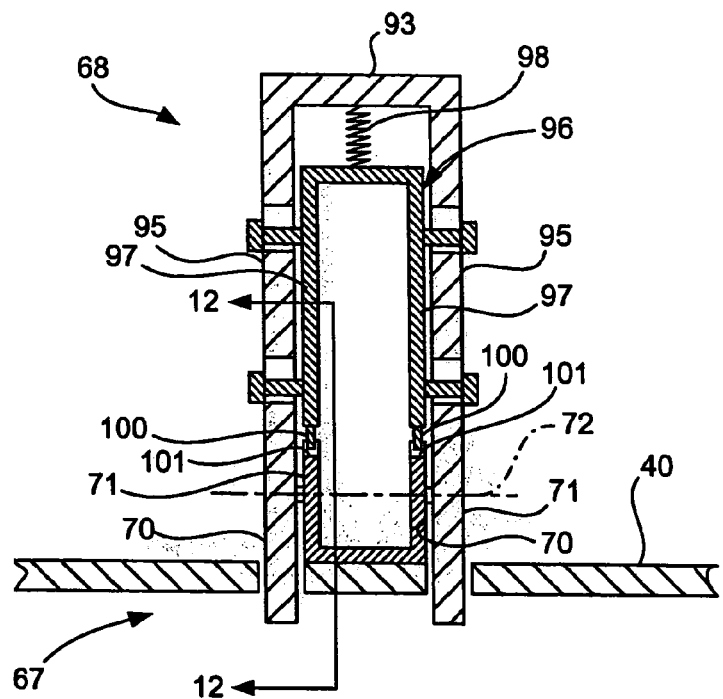
FIG. 11 is an enlarged, fragmentary, front elevation view, in cross-section, of a handle member and sliding bar of the release device.
Figure 12:
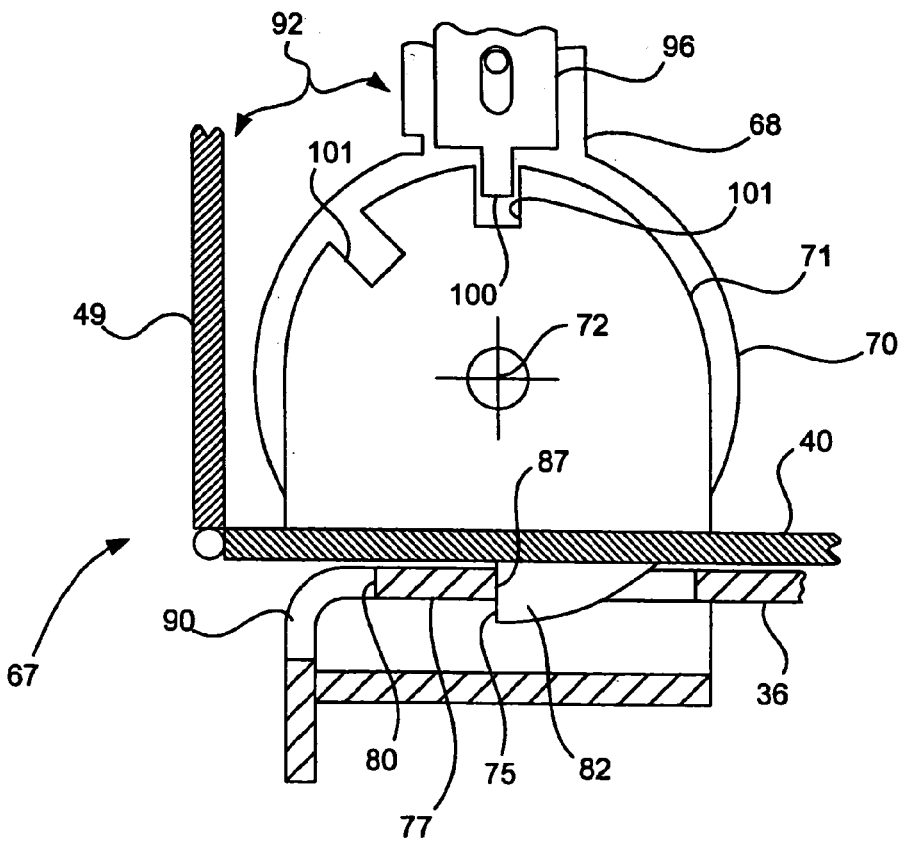
FIG. 12 is a fragmentary, enlarged, side elevation view of a locking device of the release device taken substantially along the planes of the line 12—12 in FIG. 11.

Upon further clockwise rotation about axis 72 in the direction of arrow 81 (i.e., from the second position toward the first position), the CPU enclosure 25 is urged in the direction of arrow 78 from the removal condition (FIGS. 3, 10B and 10C) to the mounting condition (FIGS. 4 and 10D). Consequently, the enclosure electrical connector 27 will be electrically coupled to the Gaming machine electrical connector 26, while the CPU enclosure 25 will be releasably mounted to the support member 36. Moreover, in this first position of the release device 67 (FIGS. 4 and 10D), the door 49 can then be moved to the closed position, and the CPU enclosure 25 is locked into the gaming machine.

To remove the CPU enclosure 25, the lever portion 68 is rotated counter clockwise in the direction of arrow 86 (FIG. 10E) where a first tooth portion 88 of the cam portion 70 is initially received in the a first opening 90 in the support member 36. Counter-clockwise rotation continues until the first cam surface 73 of the cam portion 70 contacts the first contact surface 80 of the tab member 77. Upon further counter-clockwise rotation of the lever portion 68 from the first position (FIGS. 4 and 10D) back toward the second (FIGS. 3 and 10B), the CPU enclosure 25 is urged in the direction of arrow 91 (FIG. 10E) from the mounting condition to the removal condition (i.e., the "set position" of FIG. 10B). This leveraged action, as a result, urges electrical disconnection of the enclosure electrical connector 27 from the Gaming machine electrical connector 26, while the CPU enclosure 25 will be released from the support member 36. Further, the second tooth portion 82 of the cam portion 70 is withdrawn from the second opening 83 and any impeding contact with the second contact surface 87 of the tab member 77 so that the CPU enclosure can be removed from the enclosure support member 36.

During insertion of the CPU enclosure 25 into pocket 37 of the enclosure support member 36, the cam portion 70 cooperates with the tab member 77 to prevent damaging contact between the enclosure electrical connector 27 and the gaming machine electrical connector 26. FIGS. 10A and 10B illustrate that when the cam portion 70 is oriented in the second position, the first tooth portion 88 is configured to extend below the base plate 40 of the enclosure 25 while the second tooth portion 82 is oriented out of interfering contact with the tab member 77 of the support member 36. Thus, the first cam surface 73 of the first tooth portion 88 effectively functions as a stop device upon abutting the first contact surface 80 of the tab member 77. This limits the insertion of the CPU enclosure 25 into the enclosure support member 36 prior to contact between the mating electrical connectors. This arrangement, accordingly, prevents the CPU connectors from inadvertent damaging contact with the gaming machine connectors during insertion into the enclosure support.

It will be understood, however, that if the release device is oriented in the first position of FIG. 10D when the CPU enclosure 25 is not mounted to the support member 36, the outer surface of the second tooth portion 82 will also contact the first contact surface 80 of the tab member 77 for impeding contact, if the enclosure is pushed into the pocket 37 of the support member. Accordingly, in either orientation of the release device 67, the cam portion 70 prevents damaging contact between the electrical connectors prior to selective operation of the lever portion 68.

Referring now to FIGS. 8, 9, 11 and 12, the release device 67 includes a locking device 92 adapted to secure the lever portion 68 in one of the first position and the second position relative the pair of opposed lever supports 71. In the preferred embodiment, the lever portion 68 generally includes a handle member 93 having a pair of leg portions 95 mounted to the cam portion 70 at a distal end thereof. The locking device 92 includes a U-shaped sliding bar 96 carried within the inside portion of the handle member 93, and having a pair of opposed arm portions 97 slideably mounted to the corresponding leg portions 95. As the opposed arm portions slide along the longitudinal axes of the leg portions of the handle member 93, the sliding bar moves toward and away from engagement with the corresponding lever supports. A biasing device 98, preferably in the form of a compression spring, biases the sliding bar 96 in a direction towards the lever support 71.

At the distal tip of each arm portion 97 is a finger portion 100 formed and dimensioned to engage strategically positioned slots 101 in the lever support 71 at the first and second positions to retain the lever portion 68 thereat. To release the locking device 92, the operator would compress the sliding bar 96 and the handle member 93, compressing the biasing device 98, and withdrawing the respective finger portion from the corresponding slot. Conversely, to engage the locking device 92 to retain the lever portion at one of the first and second positions, the sliding bar 96 can be released which enables the compression spring to extend the finger portion 100 into one of the slots 101.

In accordance with another aspect of the present invention, the CPU enclosure includes a safety interlock system arranged to interrupt power to the CPU enclosure 25 from the main power supply of the gaming machine 21 in the event an attempt is made to remove or insert the CPU enclosure while power is still applied to the enclosure. As mentioned, this configuration prevents component damage caused by arcing between the CPU electrical connector and the gaming machine electrical connector while current is still flowing therebetween (i.e., by hot swapping).

Figure 13:
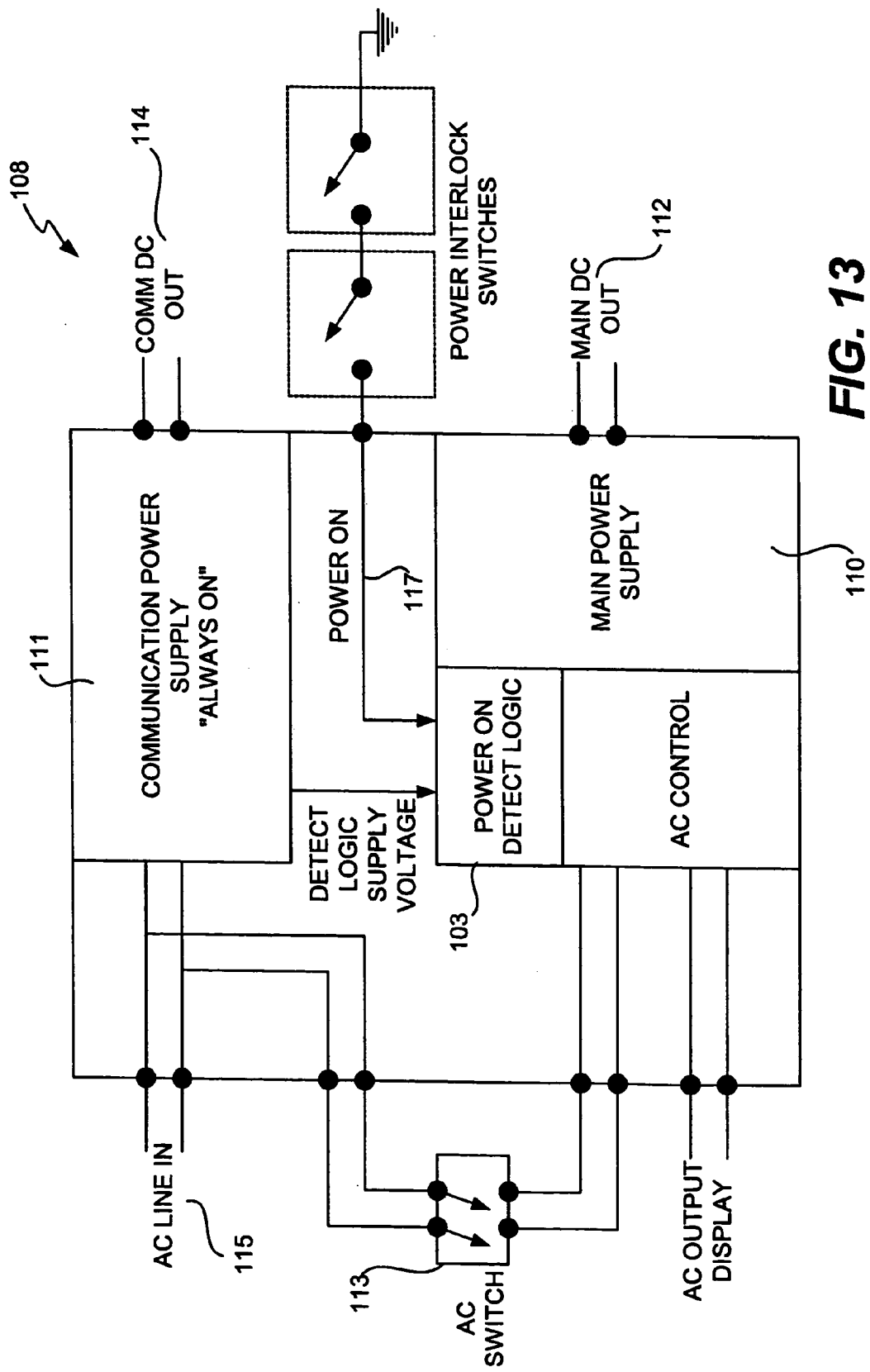
FIG. 13 is a diagram of the power control circuit in accordance with the present invention.

In one embodiment, the safety interlock system includes a sensing device 102 adapted to detect movement of the CPU enclosure to and from the mounting condition. Upon movement detection, a logic control circuit 103, illustrated in FIG. 13, instructs the main power supply to power-off. For example, as shown in FIGS. 3, 4, 8 and 9, the sensing device 102 includes a tongue 105 extending outwardly from the handle member 93 of the lever portion 68. The tongue 105 is adapted to engage and depress a sensor switch 106 accessible through an aperture 107 in the front plate 45 when the release device 67 is oriented in the first position (FIG. 4). Upon counter-clockwise rotational movement of the release device 67 from the first position to the second position (FIGS. 3 and 8), the tongue 105 disengages from the sensor switch 106, signaling the logic circuit 103 to power-off the main power supply. Thus, the sensor switch 106 generates a first signal when the switch is depressed, and a second signal when not depressed. The first signal preferably corresponds to a power-on signal, while the second signal generally corresponds to a power-off signal.

Correspondingly, when the release device 67 is initially rotated from the first position to the second position, to disconnect the mated connectors 26, 27, the sensor switch 106 contacts are opened and the main power supply is de-energized (if the main power switch is activated). It should be noted, however, that the sensor switch 106 has no effect on the performance of the main power supply if it has been already powered-off. Preferably, this de-energizing operation occurs prior to the operable disconnection between the enclosure electrical connector 27 and the gaming machine electrical connector 26 to prevent arcing. By way of example, such de-energization can occur in as little as about 8 ms to about 16 ms prior to disconnection.

Referring back to FIG. 13, the power control circuit 108 of the present invention will now be described in detail. The power control circuit 108 generally includes a high wattage main power supply 110 and a low wattage communication power supply 111. The main power supply 110 provides power to the game control electronics and other peripheral devices in the system through main DC out 112, while the communication power supply 111 energizes the communication interface through COMM DC out 114. The main power supply 110 is generally switched on and off by a mechanical switch 113. As shown, the mechanical switch 113 is coupled between the main power supply 110 and an AC input 115. The communication power supply 111 (or COMM supply) is also coupled to the AC input 115 and is always energized when the gaming system is plugged into the AC outlet.

The power control circuit 108 also includes a logic control device 103, which is powered by the COMM power supply 111. The logic control device 103 is configured to monitor a low voltage power-on signal 117 generated by the sensor switches 106. As mentioned, the sensor switch 106 is arranged to detect the insertion of the enclosure support in the gaming machine. Correspondingly, if the logic control circuit 103 detects that the power-on signal 117 is at a logic low level, then the main power supply 110 is permitted to be energized provided the AC input switch is in the "on" position. Conversely, if the logic control device 103 detects that the power-on signal 117 is at a logic high level, then the main power supply 110 is arranged to be immediately de-energized, thus returning the gaming machine 21 to a main power off state.

Furthermore, it should be noted that the events surrounding the insertion and extraction of the CPU enclosure can be monitored and stored. That is, the first and second signals may be applied to time-stamp and record the activities associated with insertion and extraction of the CPU enclosure. By way of example, the CPU may record the date and time that the CPU enclosure was installed or uninstalled. It should be noted that the CPU enclosure include an internal battery to ensure continuous recording regardless of whether external power is supplied to the gaming machine.

In another embodiment, the sensing device may be coupled to the lever portion of the release device of the CPU enclosure such that when the lever portion is oriented in the second position, CPU enclosure remains energized. Conversely, when the release device is moved from the second position toward the first position, the sensing device signals the main power supply to interrupt power to the CPU enclosure. The sensor switches, for example, may be provided by microswitches or the like.

Referring back to FIGS. 8 and 9, the lock mechanism 51 cooperates between the door 49 and the enclosure 25 to prevent unauthorized movement of the door from the closed position to the open position. In the preferred form, the lock mechanism 51 includes both a primary locking member 118 and a secondary locking member 135. The primary locking member is movably mounted to the door between a locked condition, engaging the enclosure 25 to lock the door 49 in the closed position, and an unlocked condition, disengaging from the door to enable movement thereof to the opened condition. Thus, the primary locking member 118 essentially prevents unauthorized access to the front access space 47, and to the important components of the CPU enclosure 25 (e.g., external connectors, release device, CD/ROM drive), regardless of whether the cabinet door 29 of the gaming machine is opened.

As shown, the primary locking member 118 includes a rotor member 121 rotatably mounted to the door 49, and a pair of locking bolts 122 are adapted for sliding receipt in corresponding engaging slots 123 formed in the enclosure structure for engagement therewith. The locking bolts 122 rotatably coupled to the rotor member for movement between the locked condition, where the distal tips thereof extend into the corresponding slots 123 in the enclosure 25 to prevent hinged movement of the door from the closed position to the opened condition. Upon rotational operation of the primary locking member 118, the rotor member urges the locking bolts 122 out of locked engagement with the corresponding slots 123 to the unlocked condition. In this manner, the door 49 can be locked or unlocked by moving the locking bolts 122.

To guide the distal tip portions of the locking bolts 122 into and out of the engaging slots 123, the locking bolts 122 cooperate with a set of corresponding guide plates 125. These plates 125 are mounted to the interior wall 126 of the door 49, and strategically positioned to align the tip portions of the locking bolts 122 into the engaging slots 123. Generally, these guide plates 125 help facilitate the translation of the rotational movement of the rotor member 121 into the generally linear displacement of the locking bolts 122 between the locked and unlocked positions.

FIG. 3 illustrates that a conventional lock device 127, accessible from the exterior wall 128 of the door 49, may be coupled to the rotor member 121 for operation thereof. For example, a lock barrel-type key or the like may be required before operation of a key head of the lock device 127 could commence. However, it should be understood that other types of keys may be used (e.g., a conventional toothed key or an electronic key application). Keys and keyholes are well known to those skilled in the art and for the sake of brevity will not be discussed in more detail. It should also be noted that the invention is not limited to keyed locks and that combination locks may also be used.

A second sensor switch 133 may be disposed in the socket 131 of the post member 132 to detect whether the lock mechanism 51 is in the locked or unlocked position. In this manner, the events surrounding the locking and unlocking of the door 49 may be monitored. By way of example, any locking or unlocking of the lock mechanism, whether authorized or unauthorized, can be recorded, and time-stamped. More specifically, the second sensor switch 133 is configured to extend into the socket 131 such that when the door 49 is in the closed position, and the lock mechanism 51 is moved to the locked condition (FIG. 14B), the neck portion 130 engages the second sensor switch 133 in the socket 131. Conversely, when the rotor member 121 is rotated to the unlocked position, the neck portion 130 is displaced out of engagement from the socket 131, and thus the second sensor switch 133. Generally, the second sensor switch 133 generates a first signal to the internal components when the second sensor switch is depressed, corresponding to the locked position, and generates a second signal when the switch is not engaged, corresponding to the unlocked position.

Alternatively, as further illustrated in FIG. 8, another secondary locking arrangement 135 is provided for securing the primary locking member 118 in the locking condition. This locking arrangement 135 includes a latch device 136 disposed adjacent the rotor member 121 along the interior wall of the door 49. When the primary locking member 118 is oriented in the locking condition, the secondary locking arrangement 135 can be operated to rotate the latch device 136 into engagement with the neck portion 130 of the rotor member 121 to prevent rotation from the locked condition to the unlocked condition.

In addition to the primary and secondary lock arrangements, a third security mechanism may be provided to limit access to the external connectors 63 positioned in the front access space 47 of the CPU enclosure 25. In order to ensure authorized access through the external connectors, such as when downloading a program or the like, one of these external connectors may be used as an electronic access device that is configured to accept an electronic key. In one implementation, a USB port is used as the electronic access device. However, it should be noted that this is not a limitation and that other connectors such as Ethernet, parallel, serial may be used. In another implementation, a smart card is used as the electronic key.

The electronic key enables authorized personnel access to the electronics inside the CPU enclosure so that a new program can be downloaded into the CPU enclosure. By way of example, the electronic key may be configured to give permission to write to the hard drive. This permission may be in the form of encrypted data that is programmed into the memory unit of the electronic key. In a particularly advantageous embodiment, the encrypted data can be changed daily to further increase security. Furthermore, the electronic key is configured to be fully contained such that a user does not need to type a user ID or password. Further still, the system may be configured to set off an alarm if an inappropriate key is used or if no key is used. By way of example, electronic keys are described in greater detail in a co-pending patent application entitled, "A Key For A Gaming Machine And Method Of Use Thereof"; U.S. Pat. Ser. No. 09/338,173, filed Jun. 22, 1999, and now issued as U.S. Patent No. 6,439,996, which is incorporated herein by reference in its entirety for all purposes.

In a manner analogous to the sensor switches, the events surrounding the authorized and unauthorized use of the electronic key can be monitored and stored. By way of example, the user information that is stored in the key can be recorded in the CPU along with the date and time of use. Accordingly, events associated with the CPU enclosure can be traced to a particular user.

As can be seen from the foregoing, the advantages of the invention are numerous. Different embodiments or implementations may have one or more of the following advantages. One advantage of the invention is that the CPU enclosure is modular thereby allowing quick field service and replacement. Another advantage of the invention is that the CPU enclosure contains a removable media mass storage device, such as, but not limited to a CD/ROM drive. As a result, the CD/ROM drive may be used to download software associated with the gaming machine or run diagnostic software for determining problems.

Another advantage of the invention is the ability to lock the CPU enclosure to protect the internal components from immediate access by unwanted persons. By way of example, a primary lock, a secondary lock and an electronic key may be incorporated into the CPU enclosure to produce a high level of system security. Another advantage of the invention is that the CPU enclosure is designed to reduce electronic emissions. By way of example, the CPU includes vent pathways, which have hexagonal holes.

Still another advantage of the invention is that the invention provides an arrangement for inserting and/or extracting the CPU enclosure from the gaming machine. The insertion and extraction is advantageously configured to protect the connectors, which are used to connect the CPU enclosure and gaming machine. Still another advantage of the invention is that the power supply of the gaming system is automatically shut off during initial extraction of the CPU enclosure from the gaming machine. That is, the main power supply is not allowed to be energized without the connectors of the CPU enclosure being installed. Accordingly, significant collateral damage caused by the accidental removal of the CPU enclosure with power applied is reduced. Yet another advantage of the present invention is that events surrounding CPU enclosure removal, CPU access and CPU insertion/extraction are recorded to further enhance the security of the system.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A removable processor enclosure apparatus for use in a gaming machine, said gaming machine having a housing defining an interior portion, CPU electrical components to perform gaming thereof, and a first electrical connector disposed in said interior portion, said enclosure apparatus comprising:
    an enclosure securably containing the CPU electrical components in an interior space thereof, and adapted for sliding receipt in the interior portion of the gaming machine housing between a mounting condition, mounting the enclosure to the housing and electrically coupling a second electrical connector of the enclosure to the first electrical connector of the housing, and a removal condition, enabling removal of said enclosure from the housing;
    a door movably mounted between an open position, allowing access to the interior space, and a closed position, preventing access to the interior space; and
    a lock mechanism including a primary lock assembly and an independently operable secondary lock assembly, said primary lock assembly includes a rotor member that selectively rotates about a rotor axis between a locked condition, to lock the enclosure and the door together to the door in the closed position, and an unlocked condition, to unlock the enclosure and the door to enable movement of the door to the opened position, and said secondary lock assembly being separate from said primary lock assembly, and radially spaced-apart from rotor axis, said secondary lock assembly including a latch device structured to selectively move between an unengaged condition and an engaged condition, to contact the primary lock assembly in the locked condition to prevent rotational movement of the rotor member to the unlocked condition.

2. The removable processor enclosure as recited in claim 1, wherein
    said door is coupled by hinges to the enclosure allowing opertion between the open position and the closed position.

3. The removable processor enclosure as recited in claim 1 wherein
    said rotor member is rotatably mounted to the door, and primary lock assembly includes a locking bolt having one end pivotally mounted to the rotor member, and another end extending into a slot of the enclosure when the primary lock assembly is moved, upon rotation of said rotor member, from the unlocked condition to the locked condition.

4. The removable processor enclosure as recited in claim 3 wherein,
    said enclosure includes a post member, defining a socket, stratgically disposed in the interior space of the enclosure, and
    said rotor member includes a neck portion rotating about a rotor axis of the rotor member as the primary lock assembly moves between the unlocked condition and the locked condition, said neck portion being received in said socket in a manner engaging the post member in the locked condition.

5. The removable processor enclosure as recited in claim 4, wherein
    said latch device of secondary lock assembly movable from an unengaged position to an engaged position, engaging the neck portion of the primary lock assembly to prevent rotation from the locked condition to the unlocked condition.

6. The removable processor enclosure as recited in claim 4, further including:
    a sensor switch disposed in said socket of the post member to detect whether the door is in the closed position, and whether the primary lock assembly is in the locked condition.

7. The removable processor enclosure as recited in claim 1 wherein,
    said latch device rotates about a secondary lock axis, substantially parallel to and spaced-apart from the rotor axis of the primary lock assembly, between the unengaged condition and the engaged condition.

8. The removable processor enclosure as recited in claim 1, further including:
    a release device interengaged between the gaming machine housing and the enclosure, and selectively movable between a first position, locking the enclosure in the mounting condition, and a second position, releasing the enclosure from the mounting condition to the removal condition and disconnecting the second electrical connector from the first electrical connector.

9. The removable processor enclosure as recited in claim 1 further including:
    an external connector device electrically coupled to selected electrical components of the enclosure apparatus, and accessible from outside of the enclosure while the enclosure is mounted to the gaming machine housing in the mounting condition.

10. The removable processor enclosure as recited in claim 9, wherein
    the external connector device is selected from the group consisting of USB connectors, Ethernet connectors, serial port connectors, parallel port connectors.

11. The removable processor enclosure as recited in claim 1 further including:
    a computer readable media electrically positioned within the interior space of the enclosure, and coupled to the electrical components therein.

12. The removable processor enclosure as recited in claim 11, wherein
    the computer readable media is one of a CD/ROM drive, DVD ROM drive, hard disk drive, magneto-optical disk drive, and magnetic tape drive.

13. A removable processor enclosure apparatus for use in a gaming machine, said gaming machine having a housing defining an interior portion, said enclosure apparatus comprising:
    an enclosure defining an interior space thereof, and adapted for sliding receipt in the interior portion of the gaming machine housing between a mounting condition, mounting the enclosure to the housing, and a removal condition, enabling removal of said enclosure from the housing;

a door movably mounted between an opened position, allowing access to the interior space, and a closed position, preventing access to the interior space; and a lock mechanism including a primary lock assembly and an independently operable secondary lock assembly spaced apart and separate from said primary lock assembly, said primary lock assembly including a rotor member having a neck portion rotating about a rotor axis of the rotor member between a locked condition, to lock the enclosure and the door together to lock the door in the closed position, and an unlocked condition, to unlock the enclosure and the door to enable movement of the door to the opened position, and said secondary lock assembly including a latch device movable from an unengaged position to an engaged position, engaging the neck portion of the primary lock assembly to prevent rotation from the locked condition to the unlocked condition.

14. The removable processor enclosure as recited in claim 13 wherein said rotor member is rotatably mounted to the door, and primary lock assembly includes a locking bolt having one end pivotally mounted to the rotor member, and another end extending into a slot of the enclosure when the primary lock assembly is moved, upon rotation of said rotor member, from the unlocked condition to the locked condition.

15. The removable processor enclosure as recited in claim 13 wherein, said enclosure includes a post member, defining a socket, strategically disposed in the interior space of the enclosure, and said neck portion of the rotor member being received in said socket in a manner engaging the post member in the locked condition.

16. The removable processor enclosure as recited in claim, 15 wherein said latch device of the secondary lock assembly is movable from an unengaged position to an engaged position, engaging the neck portion of the primary lock assembly to prevent rotation from the locked condition to the unlocked condition.

17. A removable processor enclosure apparatus for use in a gaming machine, said gaming machine having a housing defining an interior portion, said enclosure apparatus comprising:

an enclosure defining an interior space thereof, and adapted for sliding receipt in the interior portion of the gaming machine housing between a mounting condition, mounting the enclosure to the housing, and a removal condition, enabling removal of said enclosure from the housing;

a release device including a manually operable portion disposed in the interior space, said release device formed to be interengaged between the gaming machine housing and the enclosure, and selectively movable between a first position, retaining the enclosure in the mounting condition, and a second position, releasing the enclosure from the mounting condition to the removal condition;

a door movably mounted between an opened position, enabling access to the manually operable portion of the release device for operation thereof, and a closed position, enclosing at least the manually operable portion of the release device inside the enclosure to prevent accessible operation thereof; and a lock mechanism including a primary lock assembly and an independently operable secondary lock assembly, said primary lock assembly operable between a locked condition, to lock the enclosure and the door together to lock the door in the closed position, and an unlocked condition, to unlock the enclosure and the door to enable movement of the door to the opened position, and said secondary lock assembly movable from an unengaged position to an engaged position, engaging the primary lock assembly to prevent movement thereof from the locked condition to the unlocked condition.

18. The removable processor enclosure as recited in claim 17 wherein said primary lock assembly includes a rotor member rotatably mounted to the door, and a locking bolt having one end pivotally mounted to the rotor member, and another end extending into a slot of the enclosure when the primary lock assembly is moved, upon rotation of said rotor member, from the unlocked condition to the locked condition.

19. The removable processor enclosure as recited in claim 18 wherein, said rotor member includes a neck portion rotating about a rotor axis of the rotor member as the primary lock assembly moves between the unlocked condition and the locked condition, and said secondary lock assembly includes a latch device configured movable from an unengaged position to an engaged position, engaging the neck portion of the primary lock assembly to prevent rotation from the locked condition to the unlocked condition.

\* \* \* \* \*